US008094046B2

(12) United States Patent
Asada et al.

(10) Patent No.: US 8,094,046 B2
(45) Date of Patent: Jan. 10, 2012

(54) SIGNAL PROCESSING APPARATUS AND SIGNAL PROCESSING METHOD

(75) Inventors: Kohei Asada, Kanagawa (JP); Tetsunori Itabashi, Kanagawa (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 994 days.

(21) Appl. No.: 12/015,824

(22) Filed: Jan. 17, 2008

(65) Prior Publication Data

US 2008/0212791 A1 Sep. 4, 2008

(30) Foreign Application Priority Data

Mar. 2, 2007 (JP) ................................. 2007-053246
Apr. 13, 2007 (JP) ................................. 2007-105711

(51) Int. Cl.
*H03M 7/00* (2006.01)

(52) U.S. Cl. .......... 341/61; 381/71.6; 381/94.2; 700/94; 704/226; 341/143

(58) Field of Classification Search .................... 341/61, 341/110, 143; 381/71.1, 71.6, 73.1, 94.1, 381/94.2, 94.7, 94.9; 700/94; 704/226–228
See application file for complete search history.

(56) References Cited

U.S. PATENT DOCUMENTS

| | | | | |
|---|---|---|---|---|
| 5,276,740 | A | 1/1994 | Inanaga et al. | |
| 5,852,667 | A * | 12/1998 | Pan et al. | 381/71.1 |
| 7,317,801 | B1 * | 1/2008 | Amir | 381/71.1 |
| 7,592,941 | B2 * | 9/2009 | Ohkuri et al. | 341/155 |
| 2008/0243496 | A1 * | 10/2008 | Wang | 704/226 |
| 2009/0220101 | A1 * | 9/2009 | Bachmann | 381/71.1 |

FOREIGN PATENT DOCUMENTS

| | | |
|---|---|---|
| EP | 1 970 901 A2 | 9/2008 |
| JP | 3-96199 | 4/1991 |
| JP | 3-214892 | 9/1991 |

OTHER PUBLICATIONS

U.S. Appl. No. 11/936,894, filed Nov. 8, 2007, Asada, et al.
U.S. Appl. No. 11/865,419, filed Oct. 1, 2007, Asada, et al.
U.S. Appl. No. 11/865,354, filed Oct. 1, 2007, Asada.
U.S. Appl. No. 11/868,815, filed Oct. 8, 2007, Itabashi, et al.
U.S. Appl. No. 11/875,374, filed Oct. 19, 2007, Asada.
U.S. Appl. No. 11/936,882, filed Nov. 8, 2007, Asada, et al.
U.S. Appl. No. 11/936,876, filed Nov. 8, 2007, Asada, et al.
U.S. Appl. No. 11/952,468, filed Dec. 7, 2007, Asada, et al.
U.S. Appl. No. 11/966,168, filed Dec. 28, 2007, Ohkuri, et al.
U.S. Appl. No. 11/966,452, filed Dec. 28, 2007, Itabashi, et al.
U.S. Appl. No. 12/795,117, filed Jun. 7, 2010, Ohkuri, et al.
European Search Report issued Sep. 13, 2010, in European Patent Office Application No. 08152062.9—1224 / 1970902.

* cited by examiner

*Primary Examiner* — Howard Williams
(74) *Attorney, Agent, or Firm* — Oblon, Spivak, McClelland, Maier & Neustadt, L.L.P.

(57) ABSTRACT

Disclosed herein is a signal processing apparatus including: a first decimation processing section for generating, based on a digital signal in a first form, a digital signal in a second form; a second decimation processing section for generating, based on the digital signal in the second form, a digital signal in a third form; a first signal processing section for processing the digital signal in the third form; an interpolation processing section for converting a digital signal in the third form outputted from the first signal processing section into a digital signal in the second form; a second signal processing section for processing the digital signal in the second form outputted from the first decimation processing section; and a combining section for combining the digital signals in the second form outputted from the interpolation processing section and the second signal processing section.

15 Claims, 18 Drawing Sheets

SIGNAL PROCESSING APPARATUS AND SIGNAL PROCESSING METHOD

CROSS REFERENCES TO RELATED APPLICATIONS

The present invention contains subject matter related to Japanese Patent Application JP 2007-105711, filed in the Japan Patent Office on Apr. 13, 2007, and to Japanese Patent Application JP 2007-053246, filed in the Japan Patent Office on Mar. 2, 2007, the entire contents of which being incorporated herein by reference.

BACKGROUND OF THE INVENTION

1. Field of the Invention

The present invention relates to a signal processing apparatus for performing signal processing on an audio signal in accordance with a given purpose, and a method therefor.

2. Description of the Related Art

A so-called noise cancellation system is known that is implemented on a headphone device and used to actively cancel an external noise that comes when a sound of content, such as a tune, is being reproduced via the headphone device. Such noise cancellation systems have been put to practical use. There are broadly two types of systems for such noise cancellation systems: a feedback system and a feedforward system.

For example, Japanese Patent Laid-open No. Hei 3-214892 describes a structure of a noise cancellation system in accordance with the feedback system in which a noise inside a sound tube worn on an ear of a user is picked up by a microphone unit provided close to an earphone unit within the sound tube, a phase-inverted audio signal of the noise is generated, and this audio signal is outputted as sound via the earphone unit, so that the external noise is reduced.

Meanwhile, Japanese Patent Laid-open No. Hei 3-96199 describes a structure of a noise cancellation system in accordance with the feedforward system in which, in essence, a noise is picked up by a microphone attached to the exterior of a headphone device, a characteristic based on a desired transfer function is given to an audio signal of the noise, and a resultant audio signal is outputted via the headphone device.

SUMMARY OF THE INVENTION

Noise cancellation systems for consumer headphone devices in practical use today are implemented in analog circuitry, whether they are in accordance with the feedback system or the feedforward system.

In order for a noise cancellation effect of the noise cancellation system to be achieved effectively, difference in phase between an external unwanted sound picked up by, for example, a microphone and a sound outputted from a driver for canceling this unwanted sound should be restricted within a certain range. In other words, in the noise cancellation system, a time between input of the external unwanted sound and output of a corresponding cancellation-use sound should be restricted within a certain range. That is, a response speed should be sufficiently fast.

When the noise cancellation system is implemented in digital circuitry, however, an A/D converter and a D/A converter need be provided at input and output of the noise cancellation system. A/D converters and D/A converters that are widely used today have too long processing time and cause too long delays to be adopted in the noise cancellation system, and it is difficult to achieve an effective noise cancellation effect therewith. In military and industrial fields, for example, A/D converters and D/A converters that have a significantly high sampling frequency and cause slight delays are used, but these A/D converters and D/A converters are very expensive, and it is not practical to adopt them in consumer devices. This is the reason why the noise cancellation systems today are implemented in analog circuitry instead of digital circuitry.

Replacement of the analog circuitry by the digital circuitry makes it easy to change or switch characteristics or an operation mode, without the need to physically change a constant in a component or replace a component, for example. In addition, in the case of an audio-related system such as the noise cancellation system, the replacement of the analog circuitry by the digital circuitry has many advantages, such as expected further improvement in sound quality.

As such, an advantage of the present invention is to enable a noise cancellation system for a consumer headphone device to be implemented in digital circuitry and nevertheless achieve a practically sufficient noise cancellation effect, for example.

According to one embodiment of the present invention, there is provided a signal processing apparatus including: a first decimation processing section configured to generate, based on a digital signal in a first form subjected to $\Delta\Sigma$ modulation with a predetermined quantization bit rate of one or more bits, a digital signal in a second form subjected to pulse-code modulation so as to have a sampling frequency of $n \times fs$, where n is a natural number and fs is a predetermined reference sampling frequency; a second decimation processing section configured to generate, based on the digital signal in the second form, a digital signal in a third form subjected to pulse-code modulation so as to have a sampling frequency of $m \times fs$, where m is a natural number less than n; a first signal processing section configured to perform predetermined signal processing based on the digital signal in the third form; an interpolation processing section configured to convert a digital signal in the third form outputted from the first signal processing section into a digital signal in the second form; a second signal processing section configured to perform the predetermined signal processing based on the digital signal in the second form outputted from the first decimation processing section; and a combining section configured to combine the digital signal in the second form outputted from the interpolation processing section and a digital signal in the second form outputted from the second signal processing section, and output a combined digital signal.

According to another embodiment of the present invention, there is provided a signal processing method, including: a first decimation processing step of generating, based on a digital signal in a first form subjected to $\Delta\Sigma$ modulation with a predetermined quantization bit rate of one or more bits, a digital signal in a second form subjected to pulse-code modulation so as to have a sampling frequency of $n \times fs$, where n is a natural number and fs is a predetermined reference sampling frequency; a second decimation processing step of generating, based on the digital signal in the second form, a digital signal in a third form subjected to pulse-code modulation so as to have a sampling frequency of $m \times fs$, where m is a natural number less than n; a first signal processing step of performing predetermined signal processing based on the digital signal in the third form; an interpolation processing step of converting a digital signal in the third form outputted in the first signal processing step into a digital signal in the second form; a second signal processing step of performing the predetermined signal processing based on the digital signal in the second form outputted in the first decimation processing step; and a combining step of combining the digital signal in the second form outputted in the interpolation processing step and a digital signal in the second form outputted in the second signal processing step, and outputting a combined digital signal.

DETAILED DESCRIPTION OF THE PREFERRED EMBODIMENTS

Hereinafter, preferred embodiments of the present invention will be described with reference to an exemplary case of headphone devices in which noise cancellation systems are implemented.

Before describing structures of the preferred embodiments, basic concepts of noise cancellation systems for headphone devices will now be described below.

As basic systems of the noise cancellation systems for the headphone devices, a system that performs servo control in accordance with a feedback system and a feedforward system are known. First, the feedback system will now be described below with reference to FIGS. 1A and 1B.

Figure 1B:
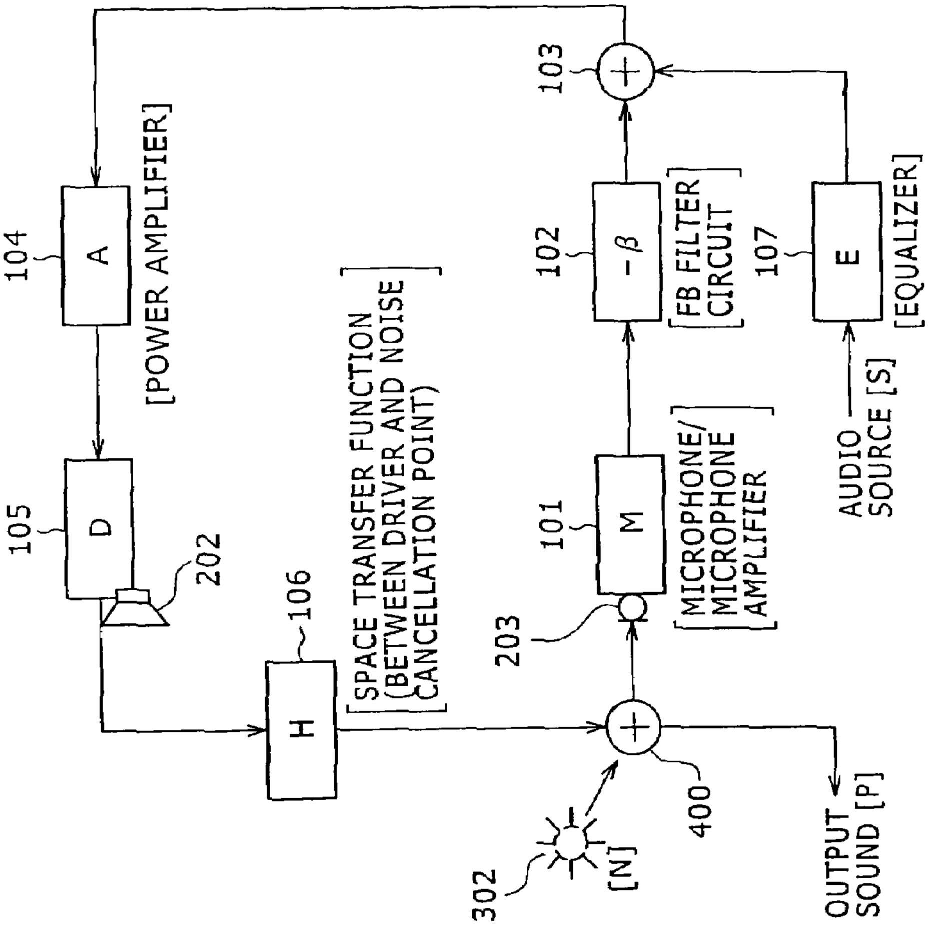
FIGS. 1A and 1B show a model example of a noise cancellation system for a headphone device in accordance with a feedback system.
Figure 1A:
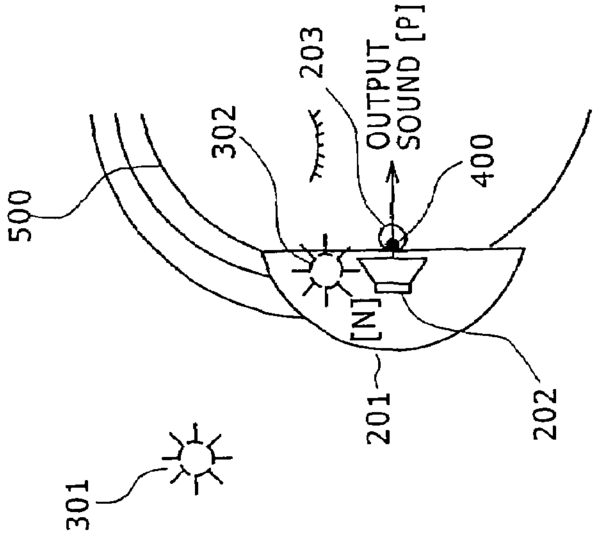

FIG. 1A is a schematic diagram of a model example of a noise cancellation system in accordance with the feedback system. FIG. 1A illustrates only a right-ear side of a user who is wearing a headphone, i.e., the side of an R-channel out of two (L (left) and R (right)) stereo channels.

Regarding a structure of the headphone device on the R-channel side, a driver 202 is provided, inside a housing section 201 corresponding to a right ear of a user 500 who is wearing the headphone device, at a location corresponding to the right ear. The driver 202 is equivalent to a so-called loudspeaker, and outputs (emits) a sound to a space as a result of being driven by an amplified output of an audio signal.

In addition, for the feedback system, a microphone 203 is provided at a location inside the housing section 201 and close to the right ear of the user 500. The microphone 203 thus provided picks up the sound outputted from the driver 202 and a sound that has come from an external noise source 301 and entered into the housing section 201, and is reaching the right ear, i.e., an in-housing noise 302 that is an external sound to be heard by the right ear. The in-housing noise 302 is caused, for example, by the sound coming from the noise source 301 intruding, as sound pressure, into the housing section 201 through a gap of an ear pad or the like, or by a housing of the headphone device vibrating as a result of receiving the sound pressure from the noise source 301 so that the sound pressure is transmitted into the inside of the housing section.

Then, from an audio signal obtained by the sound pickup by the microphone 203, a signal (i.e., a cancellation-use audio signal) for canceling (attenuating or reducing) the in-housing noise 302, e.g., a signal having an inverse characteristic relative to an audio signal component of the external sound, is generated, and this signal is fed back so as to be combined with an audio signal (audio source) of a necessary sound for driving the driver 202. As a result, at a noise cancellation point 400, which is set at a location inside the housing section 201 and corresponding to the right ear, the sound outputted from the driver 202 and the external sound are combined to obtain a sound in which the external sound is cancelled, so that the resulting sound is heard by the right ear of the user. The above structure is also provided on an L-channel (left ear) side, so that a noise cancellation system for a common dual (L and R) channel stereo headphone device is obtained.

FIG. 1B is a block diagram of a basic model structure example of the noise cancellation system in accordance with the feedback system. In FIG. 1B, as in FIG. 1A, only components corresponding to the R-channel (right ear) side are shown. Note that a similar system structure is provided on the L-channel (left ear) side as well. Blocks shown in this figure each represent a single specific transfer function corresponding to a specific circuit portion, circuit system, or the like in the noise cancellation system in accordance with the feedback system. These blocks will be referred to as "transfer function blocks" herein. A character written in each transfer function block represents a transfer function of the transfer function block. An audio signal (or sound) that passes through one of the transfer function blocks is given the transfer function written in that transfer function block.

First, the sound picked up by the microphone 203 provided inside the housing section 201 is obtained as an audio signal that has passed through a transfer function block 101 (whose transfer function is M) corresponding to the microphone 203 and a microphone amplifier that amplifies an electrical signal obtained by the microphone 203 and outputs the audio signal. The audio signal that has passed through the transfer function block 101 is inputted to a combiner 103 through a transfer function block 102 (whose transfer function is −β) corresponding to a feedback (FB) filter circuit. The FB filter circuit is a filter circuit having set therein a characteristic for generating the aforementioned cancellation-use audio signal from the audio signal obtained by the sound pickup by the microphone 203. The transfer function of the FB filter circuit is denoted as −β.

It is assumed here that an audio signal S of the audio source, which is content such as a tune, is equalized by an equalizer, and that the audio signal S is inputted to the combiner 103 through a transfer function block 107 (whose transfer function is E) corresponding to the equalizer.

The combiner 103 combines (adds) the above two signals together. A resultant audio signal is amplified by a power amplifier and outputted to the driver 202 as a driving signal, so that the audio signal is outputted via the driver 202 as a sound. That is, the audio signal outputted from the combiner 103 passes through a transfer function block 104 (whose transfer function is A) corresponding to the power amplifier, and then passes through a transfer function block 105 (whose transfer function is D) corresponding to the driver 202, so that the sound is emitted to the space. The transfer function D of the driver 202 depends on a structure of the driver 202 and so on, for example.

The sound outputted from the driver 202 passes through a transfer function block 106 (whose transfer function is H) corresponding to a space path (space transfer function) from the driver 202 to the noise cancellation point 400 to reach the noise cancellation point 400, and is combined with the in-housing noise 302 at this point in space. As a result, in sound pressure P of an output sound that travels from the noise cancellation point 400 to reach the right ear, for example, the sound from the noise source 301 that has entered into the housing section 201 is cancelled.

In the model example of the noise cancellation system as illustrated in FIG. 1B, the sound pressure P of the output sound is given by expression 1 below, using the transfer functions M, −β, E, A, D, and H written in the transfer function blocks, on the assumption that the in-housing noise 302 is N and the audio signal of the audio source is S.

$$P = \frac{1}{1 + ADHM\beta}N + \frac{AHD}{1 + ADHM\beta}ES \qquad \text{[Expression 1]}$$

It is apparent from the above expression 1 that the in-housing noise 302, N, is attenuated by a coefficient 1/(1+ADHMβ). Note, however, that in order for the system as shown by expression 1 to operate stably without occurrence of oscillation in a frequency range of the noise to be reduced, expression 2 below need be satisfied.

$$\left|\frac{1}{1 + ADHM\beta}\right| < 1 \qquad \text{[Expression 2]}$$

Generally, considering the fact that an absolute value of the product of the transfer functions in the noise cancellation system in accordance with the feedback system is expressed as 1<<|ADHMβ| and Nyquist stability determination in a classic control theory, expression 2 can be interpreted as follows.

Consider a system that is represented by −ADHMβ and which is obtained by cutting, at one point, a loop portion related to the in-housing noise 302, N, in the noise cancellation system as illustrated in FIG. 1B. This system will be referred to as an "open loop" herein. For example, this open loop can be formed when the above loop portion is cut at a point between the transfer function block 101 corresponding to the microphone and the microphone amplifier and the transfer function block 102 corresponding to the FB filter circuit.

Figure 2:
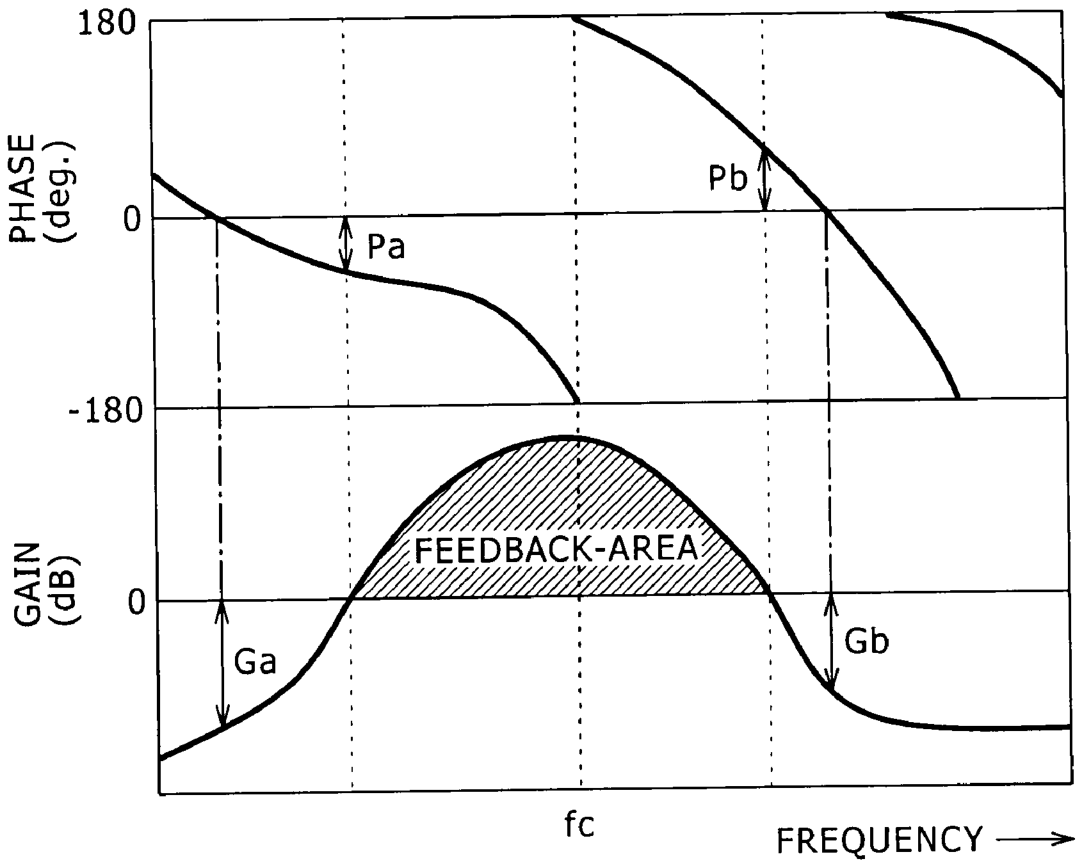
FIG. 2 is a Bode plot showing characteristics concerning the noise cancellation system as shown in FIGS. 1A and 1B.

This open loop has characteristics shown by a Bode plot of FIG. 2, for example. In this Bode plot, a horizontal axis represents frequency, whereas in a vertical axis, gain is shown in the lower half and phase is shown in the upper half.

In the case of this open loop, in order for expression 2 above to be satisfied based on the Nyquist stability determination, two conditions below need be satisfied.

Condition 1: The gain should be less than 0 dB when a point of phase 0 deg. (0 degrees) is passed.

Condition 2: A point of phase 0 deg. should not be passed when the gain is equal to or greater than 0 dB.

When the two conditions 1 and 2 are not satisfied, the loop involves a positive feedback, resulting in occurrence of oscillation (howling). In FIG. 2, gain margins Ga and Gb corresponding to condition 1 above and phase margins Pa and Pb corresponding to condition 2 above are shown. If these margins are small, the probability of the occurrence of oscillation is increased depending on various differences between individual users who use the headphone device to which the noise cancellation system is applied, variations in how the headphone device is worn, and so on.

In FIG. 2, for example, when points of phase 0 deg. are passed, the gain is less than 0 dB, resulting in the gain margins Ga and Gb. However, in the case where when a point of phase 0 deg. is passed, the gain is equal to or greater than 0 dB, resulting in absence of the gain margin Ga or Gb, or in the case where when a point of phase 0 deg. is passed, the gain is less than 0 dB but close to 0 dB, resulting in a small gain margin Ga or Gb, for example, oscillation occurs or the probability of the occurrence of oscillation is increased.

Similarly, in FIG. 2, when the gain is equal to or greater than 0 dB, a point of phase 0 deg. is not passed, resulting in the phase margins Pa and Pb. However, in the case where when the gain is equal to or greater than 0 dB, a point of phase 0 deg. is passed, or in the case where when the gain is equal to or greater than 0 dB, the phase is close to 0 deg., resulting in a small phase margin Pa or Pb, for example, oscillation occurs or the probability of the occurrence of oscillation is increased.

Next, a case where, with the structure of the noise cancellation system in accordance with the feedback system as illustrated in FIG. 1B, a necessary sound is reproduced and outputted by the headphone device while the external sound (noise) is cancelled (reduced) will now be described below.

Here, the necessary sound is represented by the audio signal S of the audio source, which is the content such as the tune.

Note that the audio signal S is not limited to that of musical content or that of other similar content. In the case where the noise cancellation system is applied to a hearing aid or the like, for example, the audio signal S will be an audio signal obtained by sound pickup by a microphone (different from the microphone 203 provided in the noise cancellation system) provided on the exterior of a housing to pick up a necessary ambient sound. In the case where the noise cancellation system is applied to a so-called headset, the audio signal S will be an audio signal of, for example, a speech by the other party as received via communication such as telephone communication. In short, the audio signal S can correspond to any sound that need be reproduced and outputted depending on the applications of the headphone device and so on.

First, focus is placed on the audio signal S of the audio source in expression 1. It is assumed that the transfer function E corresponding to the equalizer is set to have a characteristic represented by expression 3 below.

$$E=(1+ADHM\beta) \quad \text{[Expression 3]}$$

When viewed in a frequency axis, the transfer characteristic E above is nearly an inverse characteristic (1+ an open-loop characteristic) relative to the above open loop. Substituting the transfer function E as given by expression 3 into expression 1 gives expression 4, showing the sound pressure P of the output sound in the model of the noise cancellation system as illustrated in FIG. 1B.

$$P=\frac{1}{1+ADHM\beta}N+ADHS \quad \text{[Expression 4]}$$

Regarding the transfer functions A, D, and H in the term ADHS in expression 4, the transfer function A corresponds to the power amplifier, the transfer function D corresponds to the driver 202, and the transfer function H corresponds to the space transfer function of the path from the driver 202 to the noise cancellation point 400. Therefore, if the microphone 203 inside the housing section 201 is provided adjacent to the ear, regarding the audio signal S, an equivalent characteristic to that obtained by a common headphone that does not have a noise cancellation capability is obtained.

Next, a noise cancellation system in accordance with the feedforward system will now be described below.

Figure 3A:
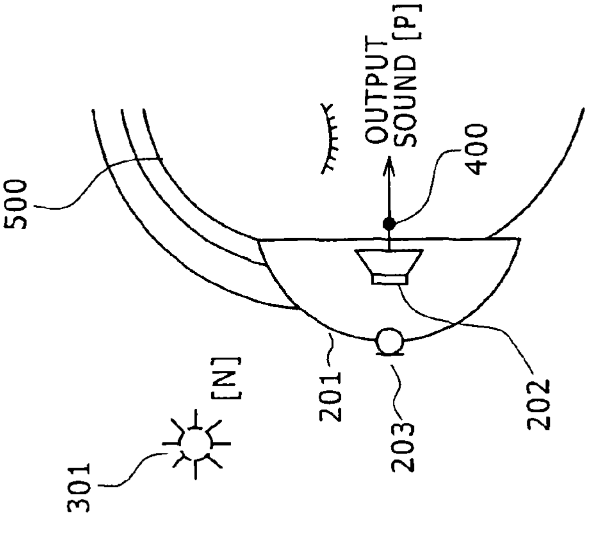
FIGS. 3A and 3B show a model example of a noise cancellation system for a headphone device in accordance with a feedforward system.

FIG. 3A illustrates a model example of the noise cancellation system in accordance with the feedforward system. As with FIG. 1A, FIG. 3A shows only an R-channel side.

In the feedforward system, a microphone 203 is provided on the exterior of a housing section 201 so that a sound coming from a noise source 301 can be picked up. The external sound, i.e., the sound coming from the noise source 301, is picked up by the microphone 203 to obtain an audio signal, and this audio signal is subjected to an appropriate filtering process to generate a cancellation-use audio signal. Then, this cancellation-use audio signal is combined with an audio signal of a necessary sound. That is, the cancellation-use audio signal, which electrically simulates an acoustic characteristic of a path between the location of the microphone 203 and the location of the driver 202, is combined with the audio signal of the necessary sound.

Then, an audio signal obtained by combining the cancellation-use audio signal and the audio signal of the necessary sound is outputted via a driver 202, so that a sound in which the sound that has come from the noise source 301 and entered into the housing section 201 is cancelled is obtained and heard at a noise cancellation point 400.

Figure 3B:
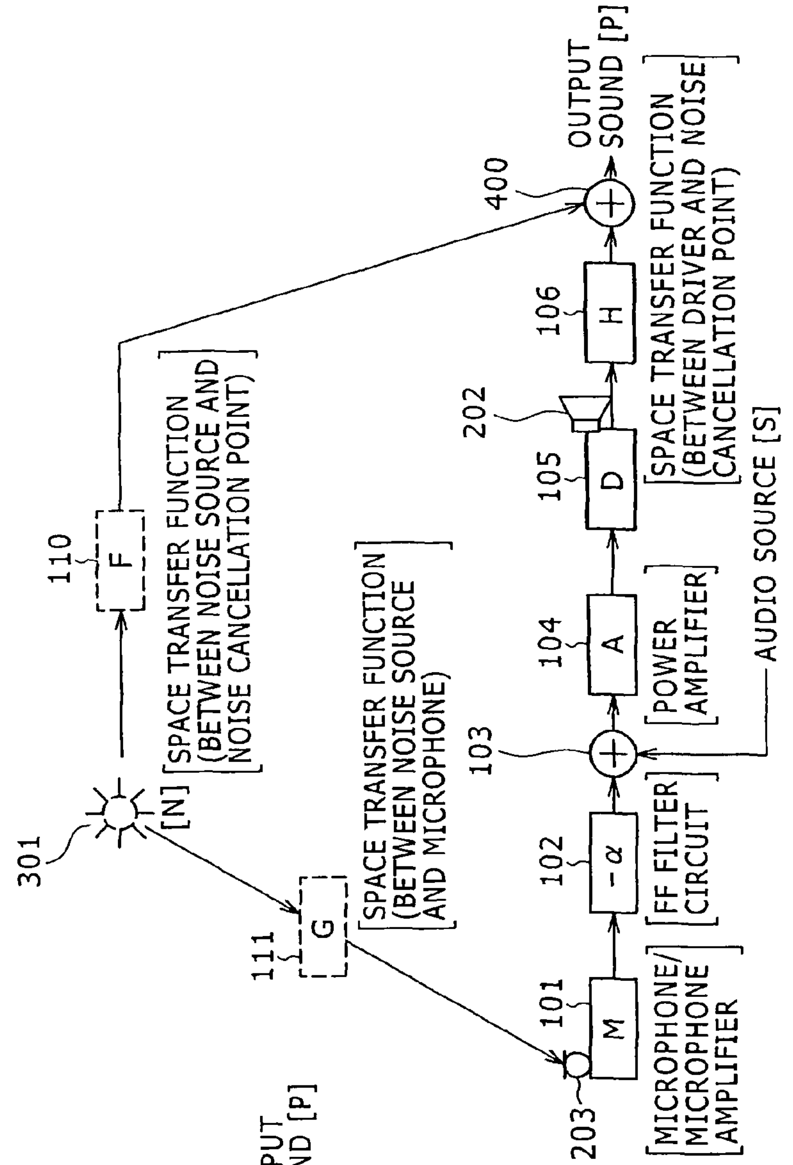

FIG. 3B illustrates a basic model structure example of the noise cancellation system in accordance with the feedforward system. In FIG. 3B, only components corresponding to one channel (the R-channel) are shown.

First, the sound picked up by the microphone 203 provided on the exterior of the housing section 201 is obtained as an audio signal that has passed through a transfer function block 101 having a transfer function M corresponding to the microphone 203 and a microphone amplifier.

Next, the audio signal that has passed through the above transfer function block 101 is inputted to a combiner 103 through a transfer function block 102 (whose transfer function is $-\alpha$) corresponding to a feedforward (FF) filter circuit. The FF filter circuit is a filter circuit having set therein a characteristic for generating the aforementioned cancellation-use audio signal from the audio signal obtained by the sound pickup by the microphone 203. The transfer function of the FF filter circuit is denoted as $-\alpha$.

An audio signal S of an audio source is directly inputted to the combiner 103.

The combiner 103 combines the above two audio signals, and a resultant audio signal is amplified by a power amplifier and outputted as a driving signal to the driver 202, so that a corresponding sound is outputted from the driver 202. That is, in this case also, the audio signal outputted from the combiner 103 passes through a transfer function block 104 (whose transfer function is A) corresponding to the power amplifier, and further passes through a transfer function block 105 (whose transfer function is D) corresponding to the driver 202, so that the corresponding sound is emitted to a space.

Then, the sound outputted from the driver 202 passes through a transfer function block 106 (whose transfer function is H) corresponding to a space path (a space transfer function) from the driver 202 to the noise cancellation point 400 to reach the noise cancellation point 400, and is combined with an in-housing noise 302 at this point in space.

As shown as a transfer function block 110, the sound that is emitted from the noise source 301, enters into the housing section 201, and reaches the noise cancellation point 400 is given a transfer function (a space transfer function F) corresponding to a path from the noise source 301 to the noise cancellation point 400. Meanwhile, the external sound, i.e., the sound coming from the noise source 301, is picked up by the microphone 203. As shown as a transfer function block 111, the sound (noise) emitted from the noise source 301 is given a transfer function (a space transfer function G) corresponding to a path from the noise source 301 to the microphone 203, before reaching the microphone 203. In the FF filter circuit corresponding to the transfer function block 102, the transfer function $-\alpha$ is set considering the above space transfer functions F and G as well.

Thus, in sound pressure P of an output sound that travels from the noise cancellation point 400 to reach the right ear, for example, the sound that has come from the noise source 301 and entered into the housing section 201 is cancelled.

In the model example of the noise cancellation system in accordance with the feedforward system as illustrated in FIG. 3B, the sound pressure P of the output sound is given by expression 5 below, using the transfer functions M, $-\alpha$, A, D, F, G, and H written in the transfer function blocks, on the assumption that the noise emitted from the noise source 301 is N and the audio signal of the audio source is S.

$$P=-GADHM\alpha N+FN+ADHS \quad \text{[Expression 5]}$$

Ideally, the transfer function F of the path from the noise source 301 to the noise cancellation point 400 is given by expression 6 below.

$$F=GADHM\alpha \quad \text{[Expression 6]}$$

Substituting expression 6 into expression 5 results in cancellation of the first and second terms on the right-hand side of expression 5. As a result, the sound pressure P of the output sound is given by expression 7 below.

$$P=ADHS \quad \text{[Expression 7]}$$

This shows that the sound coming from the noise source 301 is cancelled, so that only a sound corresponding to the audio signal of the audio source is obtained. That is, in theory, the sound in which the noise is cancelled is heard by the right ear of the user. In practice, however, it is difficult to construct such a perfect FF filter circuit as to give the transfer function that completely satisfies expression 6. Moreover, differences in the shape of ears and how to wear the headphone device are relatively large between different individuals, and it is known that changes in relationships between a location at which the noise arises and a location of the microphone affect the effect of noise reduction, particularly with respect to middle and high frequency ranges. Accordingly, concerning the middle and high frequency ranges, active noise reduction processing is often omitted while, primarily, passive sound insulation is performed depending on the structure of the housing of the headphone device and so on.

Note that expression 6 means that the transfer function of the path from the noise source 301 to the ear is imitated by an electric circuit containing the transfer function $-\alpha$.

In the noise cancellation system in accordance with the feedforward system as illustrated in FIG. 3A, the microphone 203 is provided on the exterior of the housing. Therefore, unlike in the noise cancellation system in accordance with the feedback system as illustrated in FIG. 1A, the noise cancellation point 400 can be set arbitrarily inside the housing section 201 in accordance with the location of the ear of the user. In common cases, however, the transfer function $-\alpha$ is fixed, and in a design stage, the transfer function $-\alpha$ is designed for a certain target characteristic. Meanwhile, the size of ears and so on vary from user to user. Therefore, there is a possibility that a sufficient noise cancellation effect is not obtained, or that a noise component is not added in opposite phase, resulting in a phenomenon such as occurrence of a strange sound.

As such, there is a general understanding that, in the case of the feedforward system, oscillation occurs with a low probability, resulting in a high stability, but it is difficult to achieve sufficient noise reduction (cancellation). On the other hand, in the case of the feedback system, large noise reduction is expected while care should be taken about system stability. Thus, the feedback system and the feedforward system have different features.

Noise cancellation systems currently used for consumer headphone devices are of an analog type, adopting analog circuitry. However, with a digital noise cancellation system whose signal processing system performs digital signal processing, it is easy to offer various functions, such as changing or switching characteristics or an operation mode of the noise cancellation system, and achieve improvement in sound quality. Thus, the digital noise cancellation system has a great advantage over an analog noise cancellation system.

Figure 4:
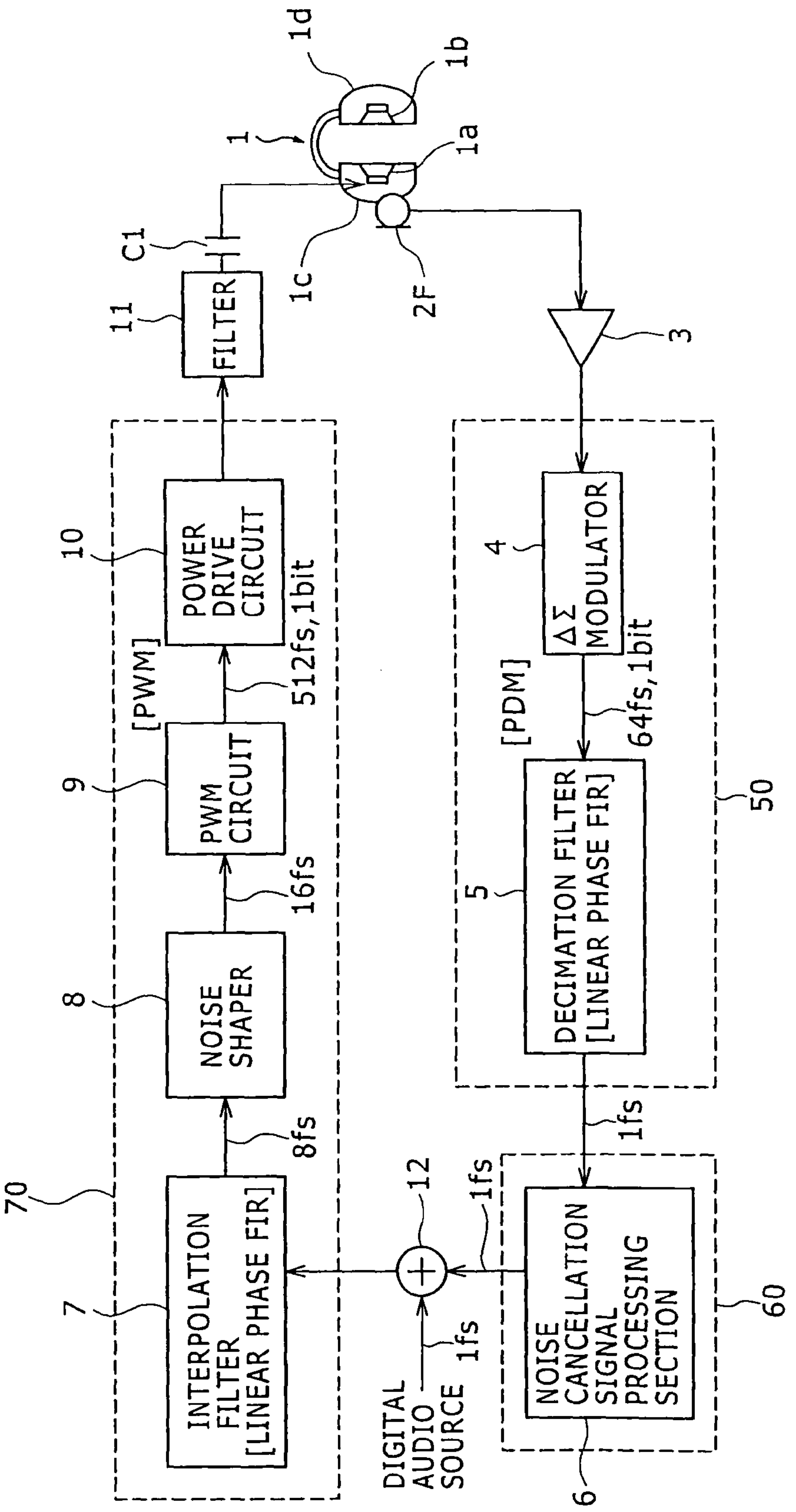
FIG. 4 is a block diagram showing a basic example of a structure of a digital noise cancellation system for the headphone device.

FIG. 4 illustrates an exemplary structure of a noise cancellation system for a headphone device constructed using digital devices currently known.

Note that the noise cancellation system as shown in FIG. 4 is structured based on the feedforward system as shown in FIG. 3.

A headphone device (hereinafter simply referred to as a "headphone") 1 shown in FIG. 4 is assumed to support dual-channel (L (left) and R (right)) stereo. A system structure as illustrated in FIG. 4 corresponds to one of an L channel and an R channel.

Also note that, in order to provide a simple and easy-to-understand description, only a system used for canceling the external sound (which comes from the noise source) is shown in FIG. 4, while a system for processing the signal of the audio source to be listened to is omitted.

In FIG. 4, first, a microphone 2F is used to pick up an external sound including an ambient sound (an external noise) for the headphone 1, which is to be cancelled. In the case of the feedforward system, this microphone 2F is commonly provided on the exterior of housings (headphone units) 1*c* and 1*d* corresponding to the two (L and R) channels of the headphone 1. In FIG. 4, the microphone 2F provided on the headphone unit 1*c* corresponding to one of the two (L and R) channels is shown.

A signal obtained by the microphone 2F by picking up the external sound is amplified by an amplifier 3, and is inputted to an A/D converter 50 as an analog audio signal.

It is assumed in the following descriptions that a reference sampling frequency denoted as fs (1 fs) corresponds to a sampling frequency of a digital audio source a sound of which is to be listened to with the headphone 1. Specific examples of the digital audio source include a compact disc (CD) on which a digital audio signal with a sampling frequency of fs (fs=44.1 kHz) and a quantization bit rate of 16 bits is recorded. Needless to say, other forms of digital audio sources, such as one with a sampling frequency of 48 kHz, may also be adopted.

The A/D converter 50 in this case is formed as a single part or device, for example, and converts the input analog signal into a PCM (Pulse Code Modulation) digital signal with a predetermined sampling frequency and quantization bit rate and outputs this signal. For this purpose, the A/D converter 50 includes a ΔΣ (delta sigma) modulator 4 and a decimation filter 5 as shown in FIG. 4, for example.

The ΔΣ modulator 4 converts the input analog audio signal into a 1-bit digital signal with a sampling frequency of 64 fs, for example. This digital signal is converted by the decimation filter 5 into a PCM digital signal with a predetermined quantization bit rate of multiple bits (here, 16 bits) corresponding to that of the digital audio source, while the sampling frequency is reduced to 1 fs, for example, and this PCM digital signal is outputted from the A/D converter 50.

In a device used as the A/D converter 50 as described above, the decimation filter 5 is commonly formed by a linear phase FIR (Finite Impulse Response) system (i.e., a linear phase FIR filter), which has a linear phase characteristic.

Since the digital signal processed in this noise cancellation system is an audio signal, it is ideally desirable, for faithfully reproducing a sound, that waveform distortion should not occur. If the signal is provided with the linear phase characteristic by the linear phase FIR filter, the waveform distortion does not occur. As is well known, with the FIR system, an accurate linear phase characteristic can be achieved easily. For this reason, the digital filter used as the decimation filter 5 is formed by the linear phase FIR filter.

As is well known, the linear phase FIR digital filter is achieved by setting a peak coefficient at a central tap while setting symmetric coefficients at the remaining taps, for example.

The digital signal outputted from the A/D converter 50 is inputted to a DSP 60.

The DSP 60 in this case is a part for at least performing necessary digital signal processing for generating an audio signal of a sound to be outputted from a driver 1*a* of the headphone 1. The DSP 60 can be provided with a necessary function by programming. As will be understood from the following description, an audio signal to be outputted from the driver 1*a* of the headphone 1 is composed of a combination of the audio signal of the digital audio source and an audio signal (i.e., a cancellation-use audio signal) for canceling the external sound picked up by the microphone 2F.

This DSP 60 is provided as a single chip or device, for example, and is configured to perform digital signal processing suited to a predetermined PCM signal form (here, a sampling frequency of 1 fs (=44.1 kHz) and a quantization bit rate of 16 bits are assumed). This PCM signal form supported by the DSP is set on the assumption that the form should be in accord with the form of the signal of the digital audio source, which is to be combined with the noise cancellation-use audio signal in this noise cancellation system.

In FIG. 4, a noise cancellation signal processing section 6 is shown as a signal processing functional block implemented in the DSP 60. The noise cancellation signal processing section 6 is formed by a digital filter that accepts and outputs data in accordance with the aforementioned PCM signal form.

This noise cancellation signal processing section 6 corresponds to the FF filter circuit as shown in FIG. 3. The digital signal outputted from the A/D converter 50, i.e., the digital audio signal corresponding to the external sound picked up by the microphone 2F, is inputted to the noise cancellation signal processing section 6. Using this input signal, the noise cancellation signal processing section 6 generates an audio signal (i.e., the cancellation-use audio signal) of a sound that is to be outputted from the driver 1*a* and which contributes to canceling an external sound that will arrive at an ear, corresponding to the driver 1*a*, of a user wearing the headphone. The cancellation-use audio signal in the simplest form is, for example, an audio signal that is in inverse relation, in terms of characteristic and phase, to the audio signal inputted to the noise cancellation signal processing section 6, i.e., the audio signal obtained by picking up the external sound. In practice, an additional characteristic (corresponding to the transfer characteristic $-\alpha$ as shown in FIG. 3) is given to the cancellation-use audio signal, taking account of transfer characteristics of circuits, spaces, and so on in the noise cancellation system.

The digital signal outputted from the noise cancellation signal processing section 6, i.e., outputted from the DSP 60 in this case, is combined by a combiner 12 with the signal of the digital audio source having the aforementioned PCM signal form (with a sampling frequency of 1 fs and a quantization bit rate of 16 bits), and the resulting combined signal is inputted to a D/A converter 70.

This D/A converter 70 is also formed as a single chip part, for example. The D/A converter 70 accepts the PCM digital signal obtained by conversion by the A/D converter 50 as described above, and converts this PCM digital signal into an analog signal. The D/A converter 70 includes an interpolation filter 7, a noise shaper 8, a PWM circuit 9, and a power drive circuit 10, as shown in FIG. 4, for example.

The digital signal inputted to the D/A converter 70 is first inputted to the interpolation filter 7. The interpolation (oversampling) filter 7 converts the input digital signal so as to raise the sampling frequency to a sampling frequency obtained by multiplying the sampling frequency of the input digital signal by a coefficient represented by a power of 2, and outputs a resultant signal. In this case, it is assumed that the sampling frequency is raised to 8 fs. In addition, as a result of the above conversion, the quantization bit rate of the input digital signal, which has a quantization bit rate of 16 bits, is reduced to a quantization bit rate of multiple bits less than 16 bits.

The interpolation filter 7 is also formed by a linear phase FIR filter for the same reason that the decimation filter 5 is formed by the linear phase FIR filter.

The digital signal outputted from the interpolation filter 7 is subjected to a process called noise shaping in the noise shaper 8. As a result of this noise shaping, the signal is converted into a different form such that the signal will have a sampling frequency (which is assumed to be 16 fs, here) obtained by multiplying the sampling frequency of the input signal by a coefficient represented by a power of 2 and a predetermined quantization bit rate lower than that of the input signal, for example. As is well known, the noise shaping is achieved as a result of $\Delta\Sigma$ modulation. Accordingly, the noise shaper 8 can be formed by a $\Delta\Sigma$ modulator. That is, the digital noise cancellation system as shown in FIG. 4 applies $\Delta\Sigma$ modulation in connection with A/D conversion and D/A conversion.

The signal outputted from the noise shaper 8 is subjected to PWM modulation in the PWM (Pulse Width Modulation) circuit 9 to be converted into a signal composed of a sequence of bits, which is inputted to the power drive circuit 10. The power drive circuit 10 includes a switching drive circuit for amplifying the signal composed of the sequence of bits with switching at a high pressure, for example, and a low-pass filter (an LC low-pass filter) for converting an amplified output therefrom into an audio signal waveform. Thus, the power drive circuit 10 produces the amplified output as an analog audio signal. Here, this output from the power drive circuit 10 is outputted from the D/A converter 70.

Predetermined unwanted frequency components of this amplified output from the D/A converter 70, for example, is removed by a filter 11, and a resultant signal is supplied as a drive signal to the driver 1*a* through a capacitor C1 used for DC blocking.

A sound outputted from the driver 1*a* driven in such a manner is composed of a combination of a sound component corresponding to the digital audio source and a sound component corresponding to the noise cancellation-use audio signal. In this sound, the sound component corresponding to the noise cancellation-use audio signal serves to cancel the external sound that comes from an outside to the ear corresponding to the driver 1*a*. As a result, in a sound heard by the ear, corresponding to the driver 1*a*, of the user wearing the headphone, the external sound is cancelled, ideally, so that the sound of the digital audio source is relatively emphasized.

In the structure as illustrated in FIG. 4, an A/D converter, a DSP, a D/A converter, and so on which are readily available for general (e.g., consumer) use are used. Therefore, this structure is a natural choice today when actually constructing a digital noise cancellation system suited to an audio source such as a CD, for example.

However, it is known that it is practically difficult to obtain a sufficient noise cancellation effect with the above structure. This is because actual devices that serve as the A/D converter 50 and the D/A converter 70 have a significantly long signal processing time (propagation time), i.e., a significantly long input-output delay.

Originally, these devices are devised to simply process the audio signal of the audio source, such as of a tune, and therefore the delay caused by signal processing has not produced a problem. However, when such devices are adopted in the noise cancellation system, the delay is too large to be neglected.

That is, with regard to the noise cancellation system as a whole constructed using such devices, a time (i.e., a response speed) between picking up of the external sound by the microphone 2F and the output of the sound from the driver involves a significant delay. Because of this delay, it is difficult to cancel the external sound with the sound component for noise cancellation outputted from the driver, for example. If the sampling frequency is 44.1 kHz and the delay corresponds to a time of 40 samples, even the A/D converter 50 alone causes a phase rotation of greater than 180° concerning a signal at a frequency higher than approximately 550 Hz, for example. When the delay is so large, not only the noise cancellation effect is hard to obtain, but also a phenomenon of the external sound being emphasized may arise.

As described above, in accordance with the structure of the digital noise cancellation system as illustrated in FIG. 4, a sufficient noise cancellation effect is obtained only within a limited frequency range of approximately 550 Hz or lower. Even in the case where a standard range of 20 Hz to 20 kHz is set as an audible range, for example, the noise cancellation effect is obtained only within a very narrow frequency range on the lower side. That is, it is difficult to obtain a practically sufficient noise cancellation effect. This is why most of the noise cancellation systems for headphone devices in practical use today are in analog form.

As noted previously, however, the digital noise cancellation system has a great advantage over the analog noise cancellation system. As such, a structure of a digital noise cancellation system for a headphone device which, despite its digital form, does not suffer from the above-described delay problem and can be put to practical use is proposed as one embodiment of the present invention as described below.

First, with reference to FIGS. 5A to 5D, how the present inventors have conceived the noise cancellation system according to the present embodiment will now be described below. Note that, in FIGS. 5A to 5D, components that have their counterparts in FIG. 4 are assigned the same reference numerals as those of their counterparts in FIG. 4, and descriptions thereof will be omitted.

Figure 5A:
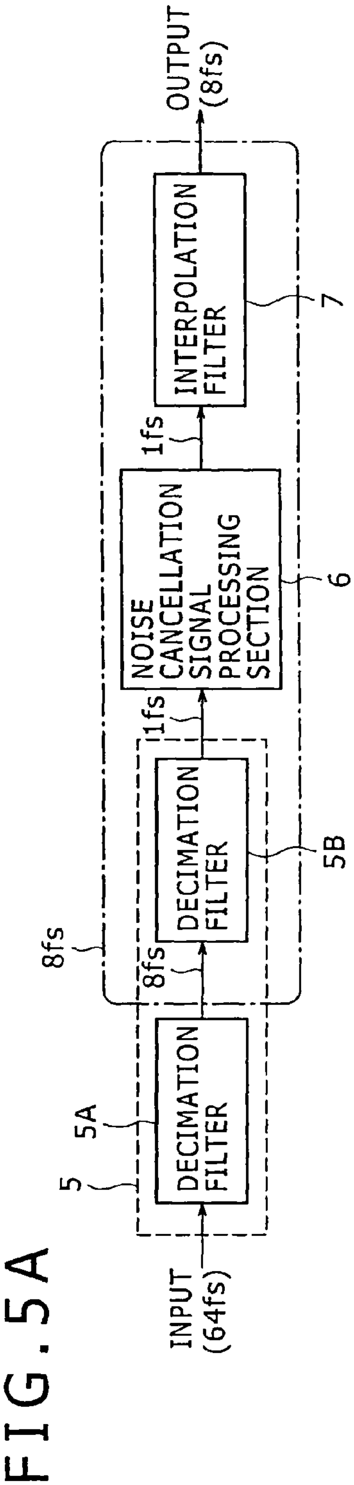
FIGS. 5A to 5D are diagrams for illustrating a dual path structure adopted by a noise cancellation system according to one embodiment of the present invention as compared with a single path structure.

FIG. 5A shows a part of the noise cancellation system as shown in FIG. 4, the part corresponding to a system for the noise cancellation-use signal composed of the decimation filter 5, the noise cancellation signal processing section 6 (i.e., the DSP 60), and the interpolation filter 7. While the decimation filter 5 is shown as one block within the A/D converter 50 in FIG. 4, the present inventors conceived of forming the decimation filter 5 of two separate decimation filters 5A and 5B connected in series as shown in FIG. 5A.

As described above with reference to FIG. 4, the decimation filter 5 converts the signal with a sampling frequency of 64 fs into the signal with a sampling frequency of 1 fs and outputs the resulting signal. In other words, the decimation filter 5 does downsampling so that the sampling frequency of the output signal is 1/64th of the sampling frequency of the input signal. Accordingly, in the structure as shown in FIG. 5A, the decimation filter 5, which performs the 1/64 downsampling, is constructed of the two decimation filters 5A and 5B each of which performs 1/8 downsampling, and the decimation filter 5A and the decimation filter 5B are connected in series such that the decimation filter 5B follows the decimation filter 5A. In accordance with this structure, the signal with a sampling frequency of 64 fs inputted to the decimation filter 5 is first converted by the decimation filter 5A into a signal with a sampling frequency of 8 fs, and this signal is outputted from the decimation filter 5A. Then, this signal with a sampling frequency of 8 fs is inputted to the decimation filter 5B and converted thereby into the PCM signal with a sampling frequency of 1 fs. In such a manner, the decimation filters 5A and 5B connected in series, each of which performs the 1/8 downsampling, achieves the 1/64 (1/8×1/8) downsampling in combination.

After passing through the decimation filter 5 (i.e., the decimation filter 5B), the signal is subjected to the same signal processing as in the structure as shown in FIG. 4. That is, the signal (i.e., the PCM signal) with a sampling frequency of 1 fs outputted from the decimation filter 5 is inputted to the noise cancellation signal processing section 6. Then, as signal processing suited to the PCM signal with a sampling frequency of 1 fs, the noise cancellation signal processing section 6 gives the input signal a predetermined characteristic to generate the cancellation-use audio signal, and outputs the cancellation-use audio signal. The cancellation-use audio signal outputted from the noise cancellation signal processing section 6 is in PCM form with a sampling frequency of 1 fs. The interpolation filter 7 accepts this cancellation-use audio signal and performs upsampling (interpolation) thereon to generate the signal with a sampling frequency of 8 fs, and outputs the resulting signal.

Here, note a system composed of the decimation filter 5B, the noise cancellation signal processing section 6, and the interpolation filter 7, which are enclosed by a chain line in FIG. 5A. The signal inputted to this system and the signal outputted from this system both have a sampling frequency of 8 fs. Hereinafter, this system enclosed by the chain line will be referred to also as an "8 fs input/output signal processing system".

When viewed as a single black box, this 8 fs input/output signal processing system can be regarded as a part that performs digital signal processing of accepting the PCM signal with a sampling frequency of 8 fs, and generating and outputting the noise cancellation-use audio signal in PCM form with the same sampling frequency of 8 fs (noise cancellation signal processing).

Figure 5B:
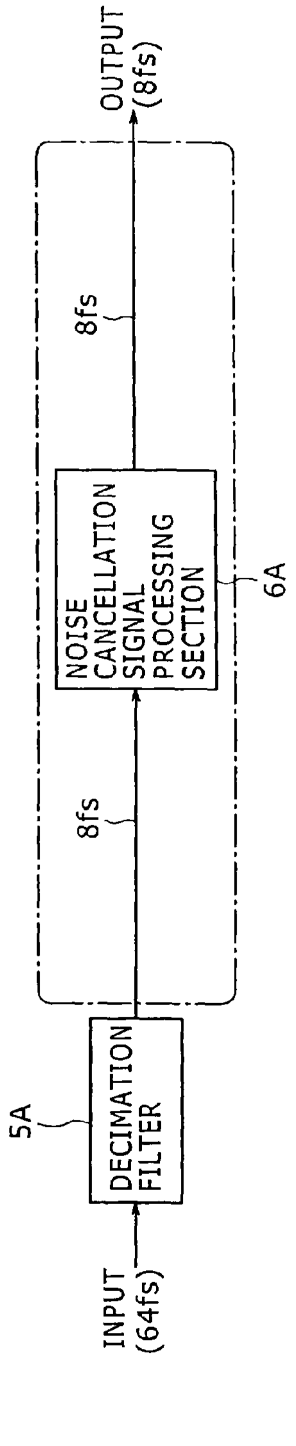

Based on the 8 fs input/output signal processing system being regarded as the part having the above function, a structure as shown in FIG. 5B can be considered adoptable as well.

In the structure as shown in FIG. 5B, the 8 fs input/output signal processing system includes only a noise cancellation signal processing section 6A. This noise cancellation signal processing section 6A directly accepts the signal with a sampling frequency of 8 fs, and performs digital signal processing suited to the PCM signal form with a sampling frequency of 8 fs to generate and output the noise cancellation-use audio signal with a sampling frequency of 8 fs.

In comparison with the structure as shown in FIG. 5A, in the structure as shown in FIG. 5B, the decimation filter 5B for performing the 1/8 downsampling in the decimation filter 5 is omitted, and, in addition, the interpolation filter 7 for performing eight times upsampling is omitted.

As noted previously, in the structure as shown in FIG. 4, the A/D converter 50 and the D/A converter 70 cause a significant delay. Regarding factors for these delays, it is known that a delay caused by the decimation filter 5 is dominant in the A/D converter 50, while a delay caused by the interpolation filter 7 is dominant in the D/A converter 70. This fact shows that the adoption of the structure as shown in FIG. 5B results in significantly reduced signal delay compared to that caused by the 8 fs input/output signal processing system as shown in FIG. 5A, i.e., the structure as shown in FIG. 4, because, in the structure as shown in FIG. 5B, the signal passes through the noise cancellation signal processing section 6A without passing through the decimation filter 5B or the interpolation filter 7.

As is deduced from the above description, the reduction in signal delay caused in the noise cancellation signal processing system makes it possible to enlarge a sound frequency range for which noise cancellation works effectively in the direction of higher frequencies. In short, the adoption of the structure as shown in FIG. 5B eliminates the problem of the noise cancellation system as shown in FIG. 4.

Now, consideration will be given to the structure of the noise cancellation signal processing section 6A when the noise cancellation system is actually constructed in accordance with the model as shown in FIG. 5B.

First, as described above with reference to FIG. 4, the noise cancellation signal processing section 6 as shown in FIG. 5A is actually realized by programming the DSP. A FIR filter is commonly used as a digital filter therein. As such, one reasonable choice when constructing the noise cancellation system in accordance with the structure of FIG. 5B is to form the noise cancellation signal processing section 6A as an FIR digital filter included in the DSP.

However, the sampling frequency of the signal processed by the noise cancellation signal processing section 6A is very high, 8 fs, which is eight times that of the signal processed by the noise cancellation signal processing section 6 as shown in FIG. 5A, as it is 1 fs. Accordingly, with a clock being fixed, the number of operations (i.e., the number of processing steps) that can be performed during one period of the sampling frequency is smaller with the noise cancellation signal processing section 6A than with the noise cancellation signal processing section 6. Specifically, assuming that the clock is 1024 fs, the number of operations that can be performed by the noise cancellation signal processing section 6A, which supports the sampling frequency of 8 fs, during one sampling period is 1024/8=128. In contrast, the number of operations that can be performed by the noise cancellation signal processing section 6, which supports the sampling frequency of 1 fs, during one sampling period is 1024/1=1024. This means that if the noise cancellation signal processing section 6A is constructed using the DSP, the noise cancellation signal processing section 6A cannot have as high a processing ability as the DSP that performs digital signal processing suited to the sampling frequency of 1 fs. In view of this fact, it is preferable that the noise cancellation signal processing section 6A be implemented in hardware.

Moreover, the cancellation-use audio signal has a very complex characteristic. Therefore, when the noise cancellation signal processing section 6A is formed by the FIR filter, a very large filter order (i.e., a very large number of taps) and enormous resources for processing are necessary to provide a signal processing ability to perform noise cancellation targeted at as wide a sound frequency range as possible. Accordingly, the present inventors considered forming the noise cancellation signal processing section 6A as an infinite impulse response (IIR) digital filter (i.e., an IIR filter) when actually constructing the model as shown in FIG. 5B, and found that even with the use of the IIR filter, it is possible to provide the noise cancellation-use audio signal with a necessary and sufficient characteristic to work as such. In other words, it was found that the IIR filter, which can be formed with a smaller filter order and smaller resources than the FIR filter, could be adopted successfully to provide the noise cancellation-use audio signal with an equivalent signal characteristic to work as such.

In the above manner, one conclusion was arrived at that it is reasonable to form the noise cancellation signal processing section 6A in the structure as shown in FIG. 5B as the IIR filter, which is implemented in hardware.

As described above, with the structure of FIG. 5B, the decimation filter 5B and the interpolation filter 7 are omitted from the noise cancellation signal processing system, and thus the signal delays caused by the decimation filter 5B and the interpolation filter 7 are eliminated, whereby the frequency range for which effective noise cancellation is achieved is enlarged in the direction of higher frequencies. That is, despite the fact that the signal processing is performed in a digital manner, practically effective noise cancellation performance can be achieved.

However, when actually constructing the noise cancellation system, it may be necessary to satisfy some other conditions than sufficient noise cancellation performance, such as flexibility concerning filter characteristics and designing, which is an advantage of the digital form, cost reduction, and size and weight reduction.

In the case where the noise cancellation system is actually constructed based on the structure of FIG. 5B, the part (i.e., the noise cancellation signal processing section 6A) for performing the noise cancellation signal processing is implemented in dedicated hardware alone, for example. In this case, however, the setting of the filter characteristics and so on are fixed, for example, and restrictions tend to be placed on the change of the setting of the filter characteristics in accordance with a switching operation, adaptive control, or the like, and on a subsequent change in filter designs. Incidentally, the DSP, which performs digital signal processing in accordance with a program, is advantageous in terms of the flexibility in the change of the filter characteristics and designs and so on.

Moreover, the noise cancellation signal processing is essentially complex, and accordingly, even when the IIR filter, implemented in hardware, is adopted as the noise cancellation signal processing section 6A, the resources required are not small. Therefore, depending on conditions, it may so happen that an unacceptably high cost or an unacceptably large circuit scale or area is necessary for the noise cancellation signal processing section 6A implemented in hardware.

In view of this fact, it is not very practical to actually construct the noise cancellation system that uses only hardware to perform digital signal processing as the noise cancellation signal processing, as shown in FIG. 5B.

Figure 5C:
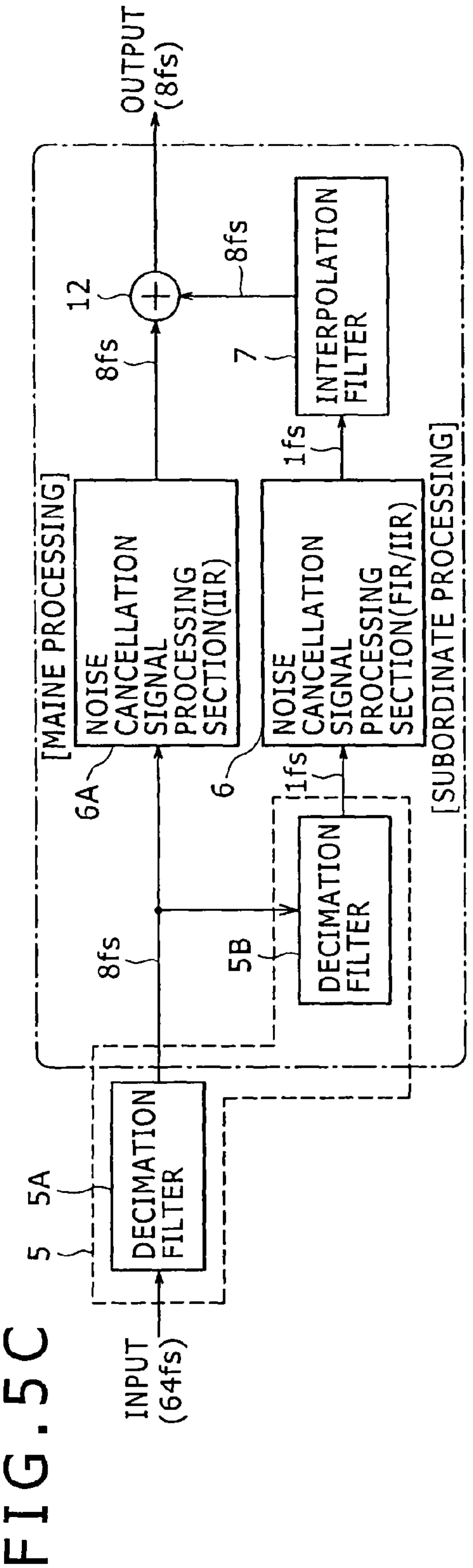

As such, the present inventors conceived a structure as shown in FIG. 5C, in which the 8 fs input/output signal processing system has two systems arranged in parallel, one including the noise cancellation signal processing section 6A and the other including the noise cancellation signal processing section 6.

As noted previously, as the delay of a signal of a sound for noise cancellation increases in the noise cancellation system, the noise cancellation effect concerning high frequencies becomes more difficult to obtain. This means, conversely, that the noise cancellation effect is easy to obtain concerning low frequencies even when a significant signal delay occurs.

Based on this fact, in the structure of FIG. 5C, the noise cancellation signal processing section 6 is configured to generate a noise cancellation signal for noise cancellation targeted at a low frequency range within the whole sound frequency range for which the noise cancellation is intended. In contrast, the noise cancellation signal processing section 6A is configured to generate a noise cancellation signal for noise cancellation targeted at middle and high frequency ranges, higher than the above low frequency range, within the whole sound frequency range for which the noise cancellation is intended.

In the above structure, the noise cancellation signal processing section 6A, which is in charge of the middle and high frequency ranges within the whole sound frequency range for which the noise cancellation is intended, performs its noise cancellation signal processing as main processing, whereas the noise cancellation signal processing section 6 can be seen as a part that performs, in an auxiliary manner, its noise cancellation signal processing as subordinate processing with respect to the low frequency range.

In the above structure, a primary need is to construct the noise cancellation signal processing section 6A, which is formed by the IIR filter implemented in hardware, so as to be capable of generating the noise cancellation-use audio signal for canceling noises in the middle and high frequency ranges. Therefore, compared to when the noise cancellation is intended for the whole sound frequency range including the low frequency range, reduction in the required amount of resources is promoted accordingly. In addition, as a result of the reduction in the hardware resources, power consumption of the noise cancellation signal processing section 6A is also reduced. This leads to a reduction in power consumption of the noise cancellation system, and when the noise cancellation system is powered by a battery, for example, the life of the battery will be extended.

Meanwhile, as noted previously, the noise cancellation signal processing section 6, which performs the digital signal processing suited to the sampling frequency of 1 fs, has a high processing performance in terms of the number of operations compared to the noise cancellation signal processing section 6A, which is suited to the sampling frequency of 8 fs. Therefore, the noise cancellation signal processing section 6 can be formed by the DSP without a problem. Thus, if the noise cancellation signal processing section 6 is formed as one function of the DSP, it becomes easy to dynamically change the setting of the filter characteristics, for example. That is, flexibility concerning signal processing is improved.

As described above, first, the structure of FIG. 5C eliminates a problem of deterioration in the noise cancellation performance owing to the delay of the noise cancellation-use audio signal. In addition, concerning the noise cancellation signal processing section 6A, which is formed by hardware logic and suited to the sampling frequency of 8 fs, further reduction in resources is achieved, and high flexibility concerning the noise cancellation signal processing is obtained.

Based on the above advantages, the present inventors arrived at the conclusion that the model form as shown in FIG. 5C will be the optimal form of the noise cancellation system at present. That is, the noise cancellation system according to one embodiment of the present invention is constructed so as to include a system for the noise cancellation-use audio signal based on the model form as shown in FIG. 5C.

In the structure of FIG. 5C, the system on the side of the noise cancellation signal processing section 6A performs the main noise cancellation signal processing targeted at the middle and high frequency ranges, while the system on the side of the noise cancellation signal processing section 6 performs the subordinate noise cancellation signal processing in an auxiliary manner targeted at the low frequency range.

As noted previously, considering the cost, a substrate surface area, and so on, for example, it is desirable that the noise cancellation signal processing section 6A, which is implemented in hardware, be formed as a small-scale circuit while reducing the resources as much as possible.

As such, the present inventors made a study assuming the case where there is the need to reduce the resources concerning the noise cancellation signal processing section 6A as much as possible, with priority placed on the reduction in cost, size, and weight of the noise cancellation system, for example. As a result, the present inventors conceived a structure as shown in FIG. 5D, which has the same model form as the structure of FIG. 5C but in which the noise cancellation signal processing section 6 takes charge of main noise cancellation signal processing while the noise cancellation signal processing section 6A takes charge of subordinate noise cancellation signal processing.

In this structure, first, the noise cancellation signal processing section 6 is configured to cancel noises in middle and low sound frequency ranges within the whole sound frequency range for which the noise cancellation is intended, for example. That is, the noise cancellation signal processing section 6 is not configured to cancel noises in a high sound frequency range above a certain level, for which effective noise cancellation effect is difficult to obtain. Meanwhile, the noise cancellation signal processing section 6A is formed as a gain control circuit for performing gain control on an input signal, or configured to calculate a moving average based on values of several samples, for example. Such a signal processing operation performed by the noise cancellation signal processing section 6A corresponds to supplementing noise cancellation signal processing for the high frequency range (i.e., generation of a noise cancellation-use audio signal for the high frequency range), in which the noise cancellation signal processing section 6 is lacking, for example.

Figure 5D:
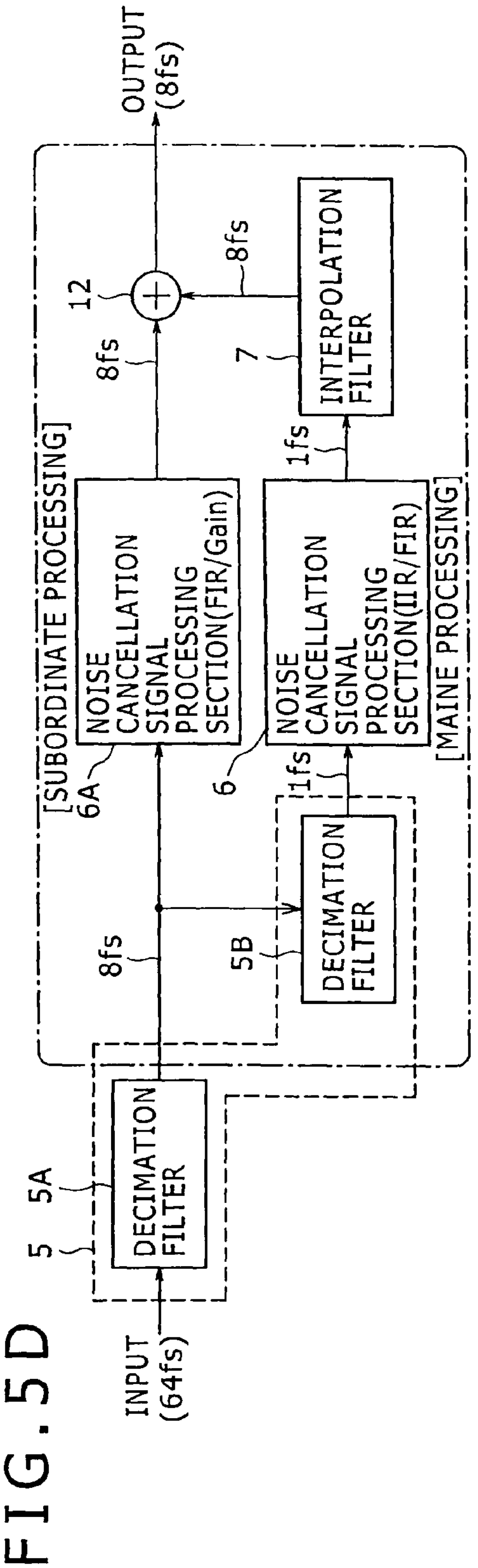

In the structure as shown in FIG. 5D, the noise cancellation signal processing section 6A can be formed by an FIR filter having only several taps, for example. That is, necessary resources are very small, and the actual hardware structure can be achieved in small scale and with a low cost.

As described above with reference to FIGS. 5C and 5D, in the present embodiment, the system for performing the noise cancellation signal processing is constructed of the two systems each of which performs digital signal processing suited to a different sampling frequency. Accordingly, despite the fact that the signal processing is performed in a digital manner, practically sufficient noise cancellation effect is achieved, the hardware resources and circuit scale are reduced to a certain level or lower, and setting flexibility concerning the noise cancellation signal processing is achieved.

One fundamental difference between FIGS. 5A and 5B and FIGS. 5C and 5D, on which the present embodiment is based, is that the structures as shown in FIGS. 5A and 5B have only one system that is suited to the sampling frequency of 1 fs or the sampling frequency of 8 fs and which performs digital signal processing to achieve the noise cancellation signal processing (i.e., the generation of the noise cancellation-use audio signal), whereas the structures as shown in FIGS. 5C and 5D have two systems that simultaneously perform the digital signal processing suited to the sampling frequency of 1 fs and the digital signal processing suited to the sampling frequency of 8 fs, respectively, to achieve the noise cancellation signal processing. In other words, in the structures as shown in FIGS. 5A and 5B, the noise cancellation signal processing is achieved by the digital signal processing suited to a single particular sampling frequency, whereas in the structures as shown in FIGS. 5C and 5D, the noise cancellation signal processing is achieved by the two types of digital signal processing performed by the two systems suited to different sampling frequencies. Note that the structure as shown in FIG. 4 is equivalent to the structure of FIG. 5A, and thus falls within a category of the former type of structure. Also note that, in the latter type of structure, a signal outputted from the system suited to the lower one (i.e., 1 fs) of the two sampling frequencies is subjected to upsampling (interpolation) so as to have the higher one (i.e., 8 fs) of the two sampling frequencies, and a signal resulting from this upsampling is combined with a signal outputted from the system suited to the higher one of the two sampling frequencies, so that a combined signal is outputted.

Hereinafter, concerning the noise cancellation signal processing system, the former type of structure corresponding to FIGS. 5A and 5B (and FIG. 4) will be referred to also as a "single path", while the latter type of structure corresponding to FIGS. 5C and 5D will be referred to also as a "dual path", based on the above difference in structure.

More specific examples of structures of noise cancellation systems according to embodiments of the present invention, which are based on the model structures of FIGS. 5C and 5D, will now be described below.

Figure 6:
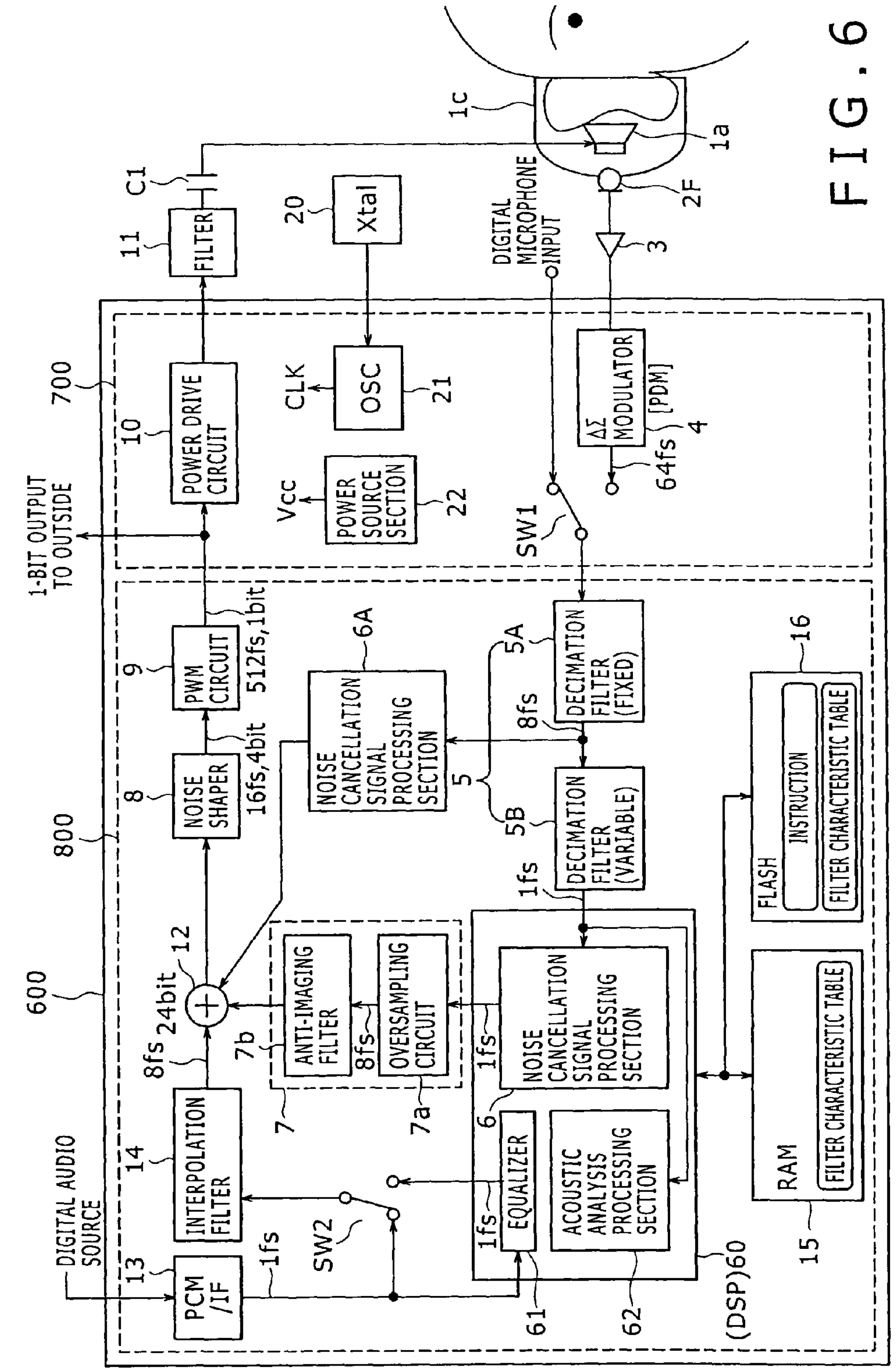
FIG. 6 is a block diagram showing an exemplary structure of a noise cancellation system according to a first embodiment of the present invention.

First, FIG. 6 is a block diagram illustrating an exemplary structure of a noise cancellation system according to a first embodiment of the present invention. Note that, in FIG. 6, components that have their counterparts in FIG. 4 are assigned the same reference numerals as those of their counterparts in FIG. 4, and descriptions that have been provided with reference to FIG. 4 and also apply to FIG. 6 will be omitted. Also note that the noise cancellation system as shown in FIG. 6 also has a structure based on the feedforward system as does the noise cancellation system as shown in FIG. 4, and corresponds to one of the two (L and R) stereo channels.

It is also assumed in this and subsequent embodiments that the reference sampling frequency fs is 44.1 kHz, corresponding to the sampling frequency of the digital audio source such as the CD, for example.

First, in the noise cancellation system according to this embodiment, parts corresponding to the A/D converter 50, the DSP 60, and the D/A converter 70 as shown in FIG. 4 are contained within a large scale integration (LSI) 600, which is a physical component as a single integrated circuit part.

The inside of the LSI 600 is broadly classified into two signal processing sections, an analog block 700 and a digital block 800.

The analog block 700 accepts and outputs analog signals, and accordingly includes the ΔΣ modulator 4, which is the first stage in the A/D converter 50, and the power drive circuit 10, which is the last stage in the D/A converter 70. In FIG. 6, the analog block 700 also includes a power source section 22 and an oscillator 21. The power source section 22 supplies direct current power with a predetermined voltage to circuits within the LSI 600. The oscillator 21 uses a signal supplied from a crystal oscillator outside of the LSI 600, for example, to output a clock (CLK) for the circuits within the LSI 600 (i.e., the analog block 700 and the digital block 800). It is assumed in the present embodiment that a clock frequency is 1024 fs.

As parts for providing functions corresponding to those of the A/D converter 50, the DSP 60, and the D/A converter 70, the digital block 800 includes parts that accept and output digital signals, such as parts other than the ΔΣ modulator 4 and the power drive circuit 10.

The analog block 700 and the digital block 800 are chips manufactured by different processes. That is, the LSI 600 in this embodiment is constructed by packaging at least the chip corresponding to the analog block 700 and the chip corresponding to the digital block 800.

Since an analog circuit and a digital circuit are sometimes manufactured as a single chip today, it is also possible to manufacture the analog block 700 and the digital block 800 as a single chip. In short, in the present embodiment, the analog block 700 and the digital block 800 may be formed either as separate chips or as a single chip, considering efficiency in manufacturing or other conditions, for example.

The configuration of functional blocks in the noise cancellation system as shown in FIG. 6 will now be described below.

First, the microphone 2F is attached to the exterior of the housing of the headphone unit 1*c*, since this noise cancellation system is in accordance with the feedforward system. The signal obtained by this microphone 2F by picking up the sound is amplified by the amplifier 3 to be converted into an analog audio signal. This analog audio signal is inputted to the LSI 600. More specifically, the analog audio signal is first inputted to the ΔΣ modulator 4 within the analog block 700, and converted therein into a digital signal with a sampling frequency of 64 fs and a quantization bit rate of 1 bit (i.e., having a [64 fs, 1 bit] form), for example. In this case, the digital signal outputted from the ΔΣ modulator 4 is inputted to one of two input terminals of a switch SW1.

In order to provide expandability, the noise cancellation system according to the present embodiment is configured to accept input from a digital microphone as well. Thus, the LSI 600 is capable of accepting a digital audio signal from the digital microphone.

The digital microphone is, for example, a unit composed of at least a microphone and a ΔΣ modulator for converting a signal obtained by this microphone by picking up a sound into a digital audio signal composed of a sequence of bits. This signal outputted from the digital microphone is inputted to the other input terminal of the switch SW1.

The switch SW1 selectively connects one of the two input terminals to an output terminal, thus performing switching. The output terminal is connected to an input of the decimation filter 5A within the digital block 800.

In either case, the signal outputted from the switch SW1 is the digital audio signal based on the sound picked up outside the headphone housing, since this noise cancellation system is in accordance with the feedforward system. The digital audio signal outputted from the switch SW1 is inputted to the decimation filter 5A.

The decimation filter 5A is connected in series with the decimation filter 5B at the following stage, and these two decimation filters 5A and 5B correspond to the decimation filter 5 in FIG. 4. Each of the decimation filters 5A and 5B is configured to perform decimation so that the sampling frequency of the output signal is ⅛th of the sampling frequency of the input signal. Thus, the decimation filters 5A and 5B connected in series combine to perform decimation so that the sampling frequency of the signal outputted from the decimation filter 5B is 1/64th (⅛×⅛) of the sampling frequency of the signal inputted to the decimation filter 5A. In other words, just as the decimation filter 5, the decimation filters 5A and 5B combine to convert the input signal with a sampling frequency of 64 fs into the output signal with a sampling frequency of 1 fs.

While the decimation filter 5A has a fixed filter characteristic, the decimation filter 5B is configured to allow a filter characteristic thereof to be variable, as will be described later.

First, the decimation filter 5A subjects the input signal with a sampling frequency of 64 fs and a quantization bit rate of 1 bit to a so-called decimation process of selectively removing data in accordance with a predetermined decimation pattern corresponding to the sampling period, thereby converting the input signal into a signal with a sampling frequency of 8 fs and a quantization bit rate of 24 bits, and outputs the resulting signal. That is, as to processing related to the sampling frequency, the decimation filter 5A performs ⅛ decimation (downsampling). The signal outputted from the decimation filter 5A is inputted to the decimation filter 5B and the noise cancellation signal processing section 6A.

The noise cancellation signal processing section 6A is formed by a digital filter, and, as will be described below, generates a noise cancellation-use audio signal with a sampling frequency of 8 fs and a quantization bit rate of 24 bits, and outputs this noise cancellation-use audio signal to the combiner 12.

Note that, in the noise cancellation system according to the present embodiment, the noise cancellation signal processing section 6 within the DSP 60 also generates a noise cancellation-use audio signal as described below.

As such, in order to distinguish these two noise cancellation-use audio signals from each other, the noise cancellation-use audio signal generated by the noise cancellation signal processing section 6 will be hereinafter referred to as a "first noise cancellation-use audio signal", while the noise cancellation-use audio signal generated by the noise cancellation signal processing section 6A will be hereinafter referred to as a "second noise cancellation-use audio signal".

As with the decimation filter 5A described above, the decimation filter 5B performs ⅛ downsampling. That is, the decimation filter 5B converts the input signal with a sampling frequency of 8 fs and a quantization bit rate of 24 bits into a PCM (Pulse Code Modulation) signal with a sampling frequency of 1 fs and a quantization bit rate of 16 bits, for example, and outputs the resulting PCM signal to the DSP 60.

The DSP 60 is provided as a unit for accepting the digital audio signal obtained based on the sound picked up by the microphone 2F and the audio signal of the digital audio source, and subjects each of these two signals to required signal processing. In this embodiment, the DSP 60 is configured to be capable of performing signal processing suited to the form of the PCM signal with a sampling frequency of 1 fs and a quantization bit rate of 16 bits, for example.

The capability of the DSP 60 to perform this signal processing is achieved by programming. A program therefor is stored in a flash memory 16, for example, as data of instructions. The DSP 60 reads necessary instructions from the flash memory 16 as appropriate and executes these instructions to perform the signal processing appropriately.

In the DSP 60 according to the present embodiment, first, the noise cancellation signal processing section 6 uses the signal inputted from the decimation filter 5B to generate the first noise cancellation-use audio signal. The noise cancellation signal processing section 6 is formed by a digital filter.

An acoustic analysis processing section 62 takes the signal inputted from the decimation filter 5B, and performs a predetermined acoustic analysis process on this signal. In accordance with a result of this analysis, the acoustic analysis processing section 62 is capable of changing the setting of a characteristic of a digital filter that functions as a specific functional part within the digital block 800.

First, the acoustic analysis processing section 62 is capable of changing the setting of the filter characteristic of the digital filter that functions as the noise cancellation signal processing section 6, which is contained in the DSP 60 as is the acoustic analysis processing section 62 itself.

The acoustic analysis processing section 62 is also capable of changing the setting of the filter characteristic of the digital filter that functions as the noise cancellation signal processing section 6A.

The acoustic analysis processing section 62 is also capable of changing the setting of the filter characteristic of the digital filter that functions as the decimation filter 5B.

The acoustic analysis processing section 62 is also capable of changing the setting of a filter characteristic of a digital filter that functions as an anti-imaging filter 7*b* within the interpolation filter 7.

In preparation for changing the filter characteristics of the above digital filters, a filter characteristic table is previously stored in the flash memory 16. A filter characteristic corresponding to the result of the above analysis is read from this filter characteristic table. Then, parameters, such as the number of taps and coefficients, corresponding to the read filter characteristic are set to form the digital filter so as to have a desired characteristic.

Moreover, a space for holding a filter characteristic table is secured in a RAM 15, for example. The acoustic analysis processing section 62 is capable of generating a new filter characteristic by performing operations and so on based on the result of analysis and so on, and storing the generated filter characteristic in the filter characteristic table in the RAM 15. When the acoustic analysis processing section 62 is capable of generating filter characteristics adaptively in accordance with the results of analysis, the flexibility and adaptability concerning the characteristics set in the digital filters are further improved, and more excellent noise cancellation effect will be obtained.

Further, an equalizer 61 can be used to perform audio-related control, correction, and the like, such as tone control, on the signal of the digital audio source inputted to the equalizer 61 as described below, and output a resultant signal.

The first noise cancellation-use audio signal (1 fs and 16 bits) outputted from the noise cancellation signal processing section 6 within the DSP 60 is inputted to the interpolation filter 7. The interpolation filter 7 performs a process of octupling the sampling frequency of the input signal with a sampling frequency of 1 fs and a quantization bit rate of 16 bits, thereby converting the input signal into a signal with a sampling frequency of 8 fs and a quantization bit rate of 24 bits, and outputs the resulting signal to the combiner 12. Here, the interpolation filter 7 is composed of an oversampling circuit 7*a* and the anti-imaging filter 7*b*. That is, in the interpolation filter 7, the input signal with a sampling frequency of 1 fs and a quantization bit rate of 16 bits is converted by the oversampling circuit 7*a* into a [8 fs, 24 bits] form, and the resulting signal is subjected to signal processing in the anti-imaging filter 7*b* so as to remove image frequency components, e.g., frequency components higher than half the sampling frequency 8 fs.

In this embodiment, the audio signal of the digital audio source passes through a PCM interface 13 and has a [1 fs, 16 bits] form, and is inputted to the DSP 60. This signal is also supplied to one of two input terminals of a switch SW2. In the DSP 60, the equalizer 61 performs a predetermined process, such as equalizing, on the input signal of the digital audio source, and the resulting signal is inputted to the other one of the input terminals of the switch SW2.

The switch SW2 selectively connects one of the two input terminals to an output terminal, thus performing switching. The output terminal of the switch SW2 is connected to an input of an interpolation filter 14. Therefore, the switch SW2 switches between a path in which the signal of the digital audio source outputted from the PCM interface 13 is inputted to the interpolation filter 14 without passing through the DSP 60 and a path in which the signal of the digital audio source outputted from the PCM interface 13 is inputted to the interpolation filter 14 after passing through the DSP 60.

As described above, the digital audio signal from the digital audio source with a sampling frequency of 1 fs and a quantization bit rate of 16 bits is inputted to the interpolation filter 14. The interpolation filter 14 performs a process of octupling the sampling frequency on this input signal, thereby converting this signal into the [8 fs, 24 bits] form, and outputs the resulting signal to the combiner 12.

In this embodiment, the combiner 12 accepts and combines the audio signal of the digital audio source, the first noise cancellation-use audio signal, which was outputted from the noise cancellation signal processing section 6 and passed through the interpolation filter 7, and the second noise cancellation-use audio signal outputted from the noise cancellation signal processing section 6A, all of which are in the [8 fs, 24 bits] form.

Thus, an audio signal outputted from the combiner 12 is composed of a combination of the audio signal of the digital audio source and a combined noise cancellation-use audio signal composed of a combination of the first and second noise cancellation-use audio signals.

This audio signal is first subjected to noise shaping in the noise shaper 8 to be converted into a digital signal with a sampling frequency of 16 fs and a quantization bit rate of 4 bits, and the resulting digital signal is subjected to PWM modulation in the PWM circuit 9 to be converted into a digital signal with a sampling frequency of 512 fs and a quantization bit rate of 1 bit. Then, the resulting digital signal composed of a sequence of bits is inputted to the power drive circuit 10 provided in the analog block 700, and converted therein into an amplified analog signal. The amplified analog signal is supplied to the driver 1*a* through the filter 11 and the capacitor C1 outside of the LSI 600.

The signal inputted to the power drive circuit 10 can also be outputted to an outside (1-bit output to outside).

The structure of the noise cancellation system according to the present embodiment as shown in FIG. 6 will now be compared with the structure as shown in FIG. 4.

In the structure of FIG. 6, the system for the signal used for noise cancellation corresponding to the system of FIG. 4 is composed of the ΔΣ modulator 4, (the switch SW1), the decimation filter 5A, the decimation filter 5B, the DSP 60 (i.e., the noise cancellation signal processing section 6), the interpolation filter 7, the combiner 12, the noise shaper 8, the PWM circuit 9, the power drive circuit 10, the filter 11, the capacitor C1, and the driver 1*a*, which are arranged in that order. This system is used for generating the first noise cancellation-use audio signal and outputting it via the driver 1*a* as a sound. In addition, the noise cancellation system as shown in FIG. 6 is provided with the noise cancellation signal processing section 6A. In other words, the noise cancellation system as shown in FIG. 6 is provided with another system for the signal used for noise cancellation, in which the second noise cancellation-use audio signal is generated from the signal outputted from the decimation filter 5A and outputted to the combiner 12. Thus, the noise cancellation system according to the present embodiment has two systems that generate the noise cancellation-use audio signal based on the signal obtained by the microphone 2F by picking up the sound.

Specifically, in the system provided with the noise cancellation signal processing section 6 within the DSP 60 for generating the first noise cancellation-use audio signal (this system will be hereinafter referred to as a "first noise cancellation signal processing system"), the signal passes through the decimation filter 5A, the decimation filter 5B, the noise cancellation signal processing section 6, the interpolation filter 7, and the combiner 12 in that order. In contrast, in the system provided with the noise cancellation signal processing section 6A for generating the second noise cancellation-use audio signal (this system will be hereinafter referred to as a "second noise cancellation signal processing system"), the signal passes through the decimation filter 5A, the noise cancellation signal processing section 6A, and the combiner 12 in that order. That is, in the first noise cancellation signal processing system, which is similar to the noise cancellation system as shown in FIG. 4, the signal passes through the decimation filters (5A and 5B) on the A/D conversion side and the interpolation (oversampling) filter 7 on the D/A conversion side. Meanwhile, in the second noise cancellation signal processing system, the signal passes through the decimation filter 5A and the noise cancellation signal processing section 6A, which accepts and outputs the signal with a sampling frequency of 8 fs, without passing through the decimation filter 5B or the interpolation filter 7. Then, the signals obtained by the first and second noise cancellation signal processing systems are combined by the combiner 12 to obtain the combined noise cancellation-use audio signal.

The above structure is nothing other than the "dual path" structure of the noise cancellation signal processing system as described above with reference to FIGS. 5C and 5D.

The noise cancellation system according to the present embodiment, which is provided with the first and second noise cancellation signal processing systems and thus has the dual path structure, can have two different basic modes, which correspond to the model structures of FIGS. 5C and 5D, respectively. These two basic modes differ in functions and roles assigned to the first and second noise cancellation signal processing systems. Here, these two functional modes will now be described below.

Figure 7:
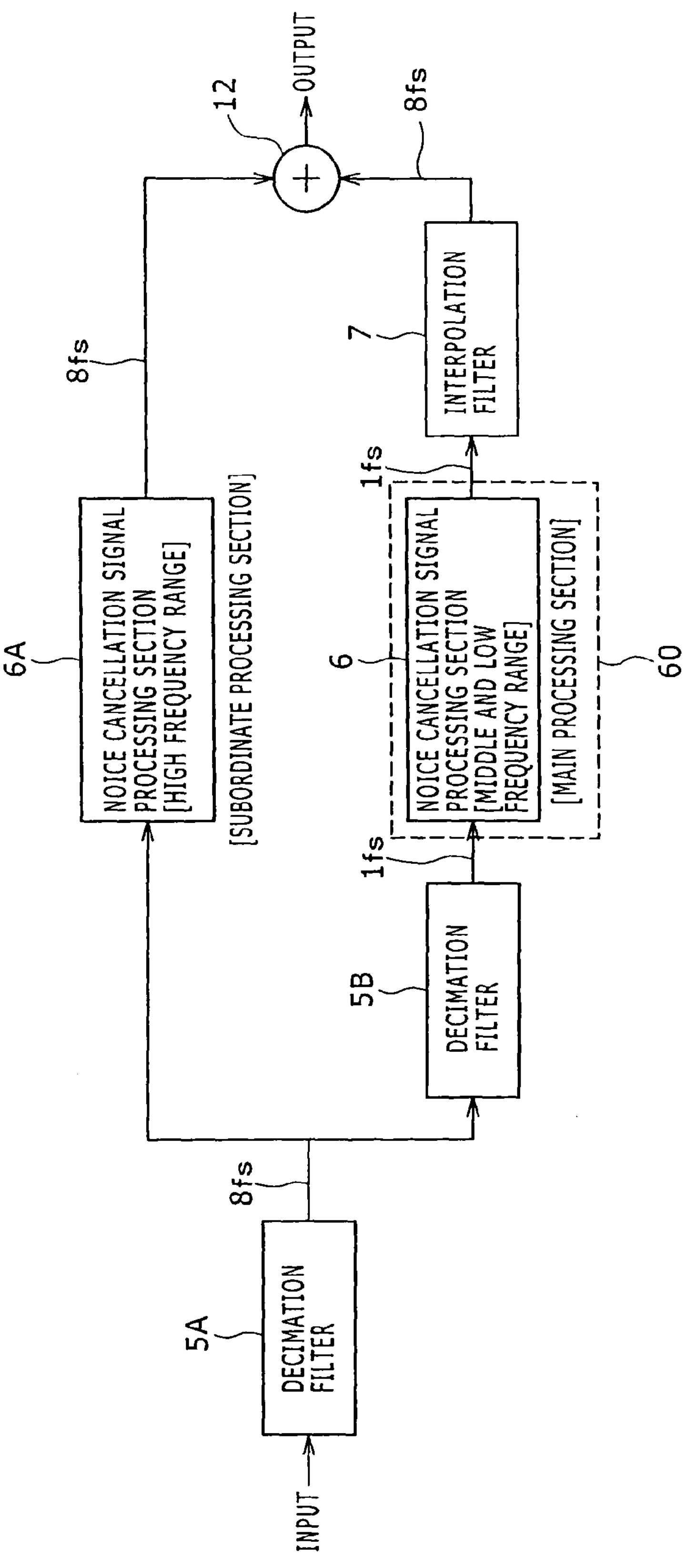
FIG. 7 shows a first functional mode according to one embodiment of the present invention, and shows an example of how frequency ranges are set for a noise cancellation signal processing section in a first noise cancellation signal processing system and a noise cancellation signal processing section in a second noise cancellation signal processing system.

FIG. 7 shows a part of the noise cancellation system as shown in FIG. 6, the part being composed of the decimation filter 5A, the decimation filter 5B, the noise cancellation signal processing section 6A, the noise cancellation signal processing section 6 within the DSP 60, the interpolation filter 7, and the combiner 12. Referring to FIG. 7, one of the two functional modes, a first functional mode, will now be described below.

As shown in FIG. 7, in the first functional mode, the noise cancellation signal processing section 6, which belongs to the first noise cancellation signal processing system corresponding to the structure of FIG. 4, is handled as a main processing section, while the noise cancellation signal processing section 6A, which belongs to the second noise cancellation signal processing system, is handled as a subordinate processing section. This mode corresponds to the structure of FIG. 5D.

The digital filter in the noise cancellation signal processing section 6, which operates as the main processing section in this case, is configured to perform noise cancellation signal processing targeted at, out of the whole sound frequency range for which noise cancellation is intended, a frequency range lower than a certain level for which effective noise cancellation effect can be obtained, as noted previously. That is, because the first noise cancellation signal processing system provided with the noise cancellation signal processing section 6 includes the decimation filter 5B and the interpolation filter 7 and thus causes the significant signal delay, it is not reasonable to expect the first noise cancellation signal processing system to achieve effective noise cancellation effect concerning the frequency range higher than the certain level. Accordingly, the first noise cancellation signal processing system is configured to generate the noise cancellation-use audio signal targeted at the middle and low frequency ranges lower than the certain level while neglecting the frequency range higher than the certain level.

Besides, the digital filter in the noise cancellation signal processing section 6A, which operates as the subordinate processing section, is configured to generate the noise cancellation-use audio signal having a characteristic for canceling the noises in the high frequency range.

As a result, the combined noise cancellation-use audio signal, which is generated by the combiner 12 by combining the two noise cancellation-use audio signals outputted from the main processing section and the subordinate processing section and then outputted from the combiner 12, functions to effect noise cancellation throughout the whole sound frequency range for which noise cancellation is intended.

As described above, the first functional mode is configured such that the first noise cancellation signal processing system achieves noise cancellation targeted at the middle and low frequency range, while the second noise cancellation signal processing system, which causes a relatively slight signal delay, operates in an auxiliary manner to cancel the noises in the high frequency range for which sufficient noise cancellation effect is difficult to achieve with the first noise cancellation signal processing system. That is, the frequency range of the noises to be cancelled is divided between the first and second noise cancellation signal processing systems (i.e., the noise cancellation signal processing sections 6A and 6).

In this case, as described above with reference to FIG. 5D, the noise cancellation signal processing section 6A can be formed with a simple hardware structure, such as by a simple gain control circuit or a circuit for calculating the moving average using the FIR filter having several taps, for example. Thus, a significant reduction in the resources and the circuit scale is achieved, for example. Meanwhile, in this case, the noise cancellation signal processing section 6 within the DSP 60 need not be configured to achieve effective noise cancellation concerning the high frequency range, and thus the resources can be reduced accordingly. This is advantageous in terms of processing capacity as well. Moreover, this simplified structure will make it easier to design the filters that function as the noise cancellation signal processing sections 6 and 6A.

Figure 8:
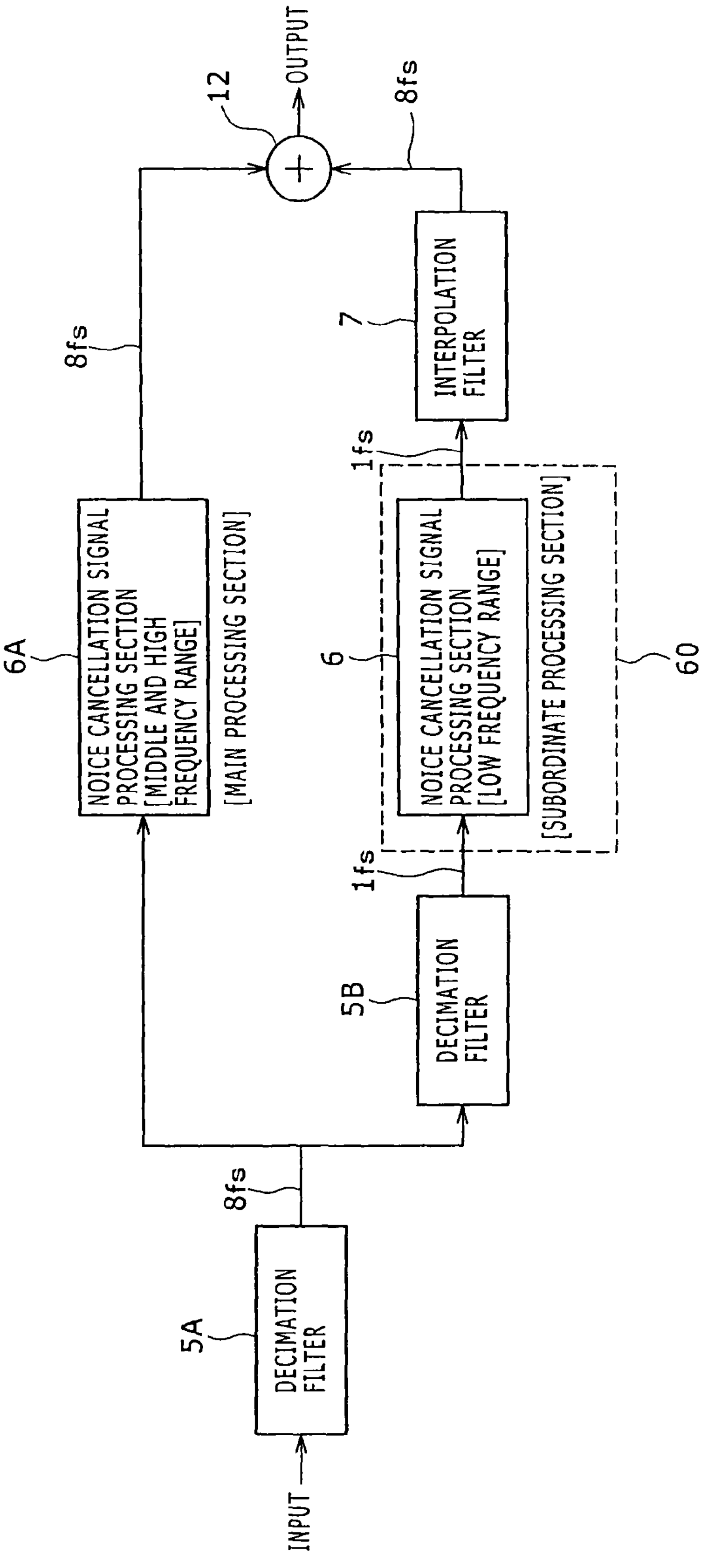
FIG. 8 shows a second functional mode according to one embodiment of the present invention, and shows an example of how frequency ranges are set for the noise cancellation signal processing section in the first noise cancellation signal processing system and the noise cancellation signal processing section in the second noise cancellation signal processing system.

Next, referring to FIG. 8, a second functional mode will now be described below. Note that, in FIG. 8, components that have their counterparts in FIG. 7 are assigned the same reference numerals as those of their counterparts in FIG. 7, and descriptions thereof will be omitted.

In the second functional mode, in contrast to the first functional mode described above with reference to FIG. 7, the second noise cancellation signal processing system functions as a main signal processing system while the first noise cancellation signal processing system functions as a subordinate signal processing system. Accordingly, the noise cancellation signal processing section 6A, which belongs to the second noise cancellation signal processing system, operates as the main processing section while the noise cancellation signal processing section 6, which belongs to the first noise cancellation signal processing system, operates as the subordinate processing section. That is, this mode corresponds to the structure of FIG. 5C.

As described above with reference to FIG. 5C, as to the division of roles, the noise cancellation signal processing section 6A, which operates as the main processing section, is configured to generate the noise cancellation signal for canceling the noises in the middle and high frequency ranges within the whole sound frequency range for which noise cancellation is intended, whereas the noise cancellation signal processing section 6, which operates as the subordinate processing section, is configured to generate the noise cancellation signal for canceling the noises in the low frequency range within the whole sound frequency range for which noise cancellation is intended.

In this case also, the combined noise cancellation-use audio signal, which is generated by the combiner 12 by combining the two noise cancellation-use audio signals outputted from the main processing section and the subordinate processing section, functions to effect noise cancellation throughout the whole sound frequency range for which noise cancellation is intended.

Note that, when actually constructing the noise cancellation system according to the present embodiment, an appropriate one of the first functional mode and the second functional mode may be adopted depending on various conditions, such as costs and specifications, required for the noise cancellation system. As will be understood from the above descriptions of FIGS. 5C and 5D, the adoption of the first functional mode is preferred when priority is placed on the reduction in cost and circuit scale. Meanwhile, the second functional mode, in which the noise cancellation signal processing section 6A, implemented in hardware, takes charge of the main signal processing, is likely to achieve more excellent noise cancellation effect. Therefore, the adoption of the second functional mode is valid when priority is placed on providing a reproduced sound with a high quality.

Here, structures of the digital filters adopted in specific functional circuit parts related to the signal processing system for noise cancellation in the digital block 800 in the noise cancellation system according to the present embodiment will now be described below.

For example, in the noise cancellation system as shown in FIG. 4, the decimation filter 5 (5A and 5B) and the interpolation filter 7 are formed by the linear phase FIR filters. As described above, this is based on the notion that, since the signal to be processed is the audio signal, it is normally necessary to prevent occurrence of phase distortion according to frequencies, for example.

While the use of the linear phase FIR filters results in occurrence of group delays between input and output of the signal, this does not pose a problem with existing devices such as A/D converters and D/A converters, because they are intended for use for reproducing (recording) a sound of the audio source, which the user positively attempts to listen to. For example, in the case where sounds of the audio source are reproduced, even if a significant delay is caused by signal processing between input of signals of the audio source into a signal processing device and reproduction of the sounds, the user can listen to the sounds normally reproduced and outputted continuously. Therefore, when the user reproduces the sounds of the audio source for listening, the delay caused by signal processing does not pose a problem.

However, if the existing devices are used in the noise cancellation system, instead of used for reproducing the sounds of the audio source, the group delays caused by these devices produce a problem, making it impossible or difficult to obtain a phase for canceling the external sound.

The noise cancellation system according to one embodiment of the present invention as shown in FIG. 6 solves this problem, firstly, by the provision of the second noise cancellation signal processing system, which includes the noise cancellation signal processing section 6A without having the decimation filter 5B or the interpolation filter 7.

It is desirable, however, that the signal delays significantly caused by the decimation filter 5 (5A and 5B) and the interpolation filter 7 within the first noise cancellation signal processing system be reduced, because a factor for lessening the noise cancellation effect is thereby reduced accordingly, so that the noise cancellation effect is heightened.

As such, in the present embodiment, as one example, the digital filters as the decimation filter 5B and the anti-imaging filter 7*b* within the interpolation filter 7 as shown in FIG. 6 are formed as minimum phase FIR filters.

Basically, a minimum phase FIR digital filter can be formed by setting a peak value at a tap coefficient on the top side (i.e., closest to the input) so that a minimum phase can be obtained as a FIR digital filter system.

For example, regarding characteristics of a linear phase FIR digital filter and a minimum phase FIR digital filter each having the same number of taps, impulse response waveforms will now be compared. First, in the case of the linear phase FIR digital filter, a peak thereof is obtained a certain fixed time after input. This means that an output responding to the input has a delay (a group delay) of the fixed time corresponding to the number of taps (i.e., the filter order). In contrast, in the case of the minimum phase FIR digital filter, a peak is obtained a short time after input, the short time corresponding to a few taps, for example. That is, in the minimum phase FIR digital filter, the delay of the output responding to the input (i.e., an input-output delay) is very short compared to in the linear phase FIR digital filter, despite the fact that both filters are FIR digital filters.

Therefore, when the minimum phase FIR filter is adopted as the decimation filter 5B and the anti-imaging filter 7*b* within the interpolation filter 7, the signal delays caused therein are reduced significantly, so that most of the factor for the signal delays is eliminated. As a result, the first noise cancellation signal processing system is expected to achieve a more excellent noise cancellation capability.

Note that, as is well known, the minimum phase FIR filter causes phase distortion according to frequencies. Accordingly, in the case of the audio signal, deterioration in sound quality caused by the phase distortion is unavoidable. This is the reason why the linear phase FIR digital filters have heretofore been adopted in the A/D converter and the D/A converter designed for the audio signal.

The signal to be processed in this case is an audio signal, indeed, but it is an audio signal of the external sound to be cancelled, for example. The degree of fidelity required for this audio signal is significantly low compared to the audio signal of the audio source and the like. Moreover, sound components for which a large cancellation effect can actually be achieved are those in a low frequency range, and therefore, in view of a characteristic of a device and so on, noise cancellation working effectively up to some kHz is supposed to be sufficient for practical use. From this standpoint, formation of the decimation filter 5B and the anti-imaging filter 7*b*, for example, as the minimum phase FIR filters does not result in a large problem with sound quality.

Note that, in the foregoing description, the decimation filter 5A and the oversampling circuit 7*a*, which are components of the decimation filter 5 and the interpolation filter 7, respectively, are not formed by the minimum phase FIR filters. That is, these parts are formed by the linear phase FIR filters.

This is because, as the factors for the signal delays caused by the decimation filter 5 and the interpolation filter 7, the decimation filter 5B and the anti-imaging filter 7*b*, respectively, are dominant. Therefore, even if the linear phase FIR filters are used in the decimation filter 5A and the oversampling circuit 7*a* with priority given to the quality in reproduced sounds or the like, the signal delay caused in the signal processing system including the noise cancellation signal processing section 6 does not produce a large problem.

As noted previously, in order to reduce the signal delay caused between input and output, it is also reasonable to form the decimation filter 5B and the anti-imaging filter 7*b* with the infinite impulse response (IIR) filters. An impulse response waveform of the IIR filter also exhibits such a characteristic that a peak is obtained a short time after input, the short time corresponding to a few taps, for example. That is, the input-output delay of the IIR filter is very short. Therefore, as is the case with the minimum phase FIR filters, formation of the decimation filter 5B and the anti-imaging filter 7*b* as the IIR filters results in a reduction in the signal delay caused in the first noise cancellation signal processing system.

The digital filter as the noise cancellation signal processing section 6 within the DSP 60 in the first noise cancellation signal processing system may be formed by either the linear phase FIR filter or the IIR filter. Note that the linear phase FIR filter or the IIR filter as the noise cancellation signal processing section 6 is a functional circuit realized by the DSP 60 operating in accordance with programming (the instructions), for example.

Note that, in the case of the first functional mode, in which the noise cancellation signal processing section 6 operates as the main processing section, it is preferable that the noise cancellation signal processing section 6 be formed by the IIR filter, even if the IIR filter is a signal processing capability of the DSP 60 as realized by programming, considering that the reduction in the resources can thus be achieved, for example.

The digital filter as the noise cancellation signal processing section 6A, which belongs to the second noise cancellation signal processing system, is implemented in dedicated hardware for generating the noise cancellation signal. Besides, the noise cancellation signal processing section 6A is formed by the linear phase FIR filter or the IIR filter.

Note, however, that, in the case of the second functional mode, in which the second noise cancellation signal processing system (i.e., the noise cancellation signal processing section 6A) functions as the main system and the first noise cancellation signal processing system (i.e., the noise cancellation signal processing section 6) functions as the subordinate system, it is at present preferable that the noise cancellation signal processing section 6A be formed by the IIR filter in order to achieve an excellent noise cancellation effect while reducing the resources required, as described above with reference to FIG. 5C.

Besides, in the case where the second functional mode is adopted, it is desirable that the setting of the characteristic of the noise cancellation signal processing section 6A, implemented in hardware, can also be changed within a certain range of latitude. In that case, the noise cancellation signal processing can be performed more adaptively than when the setting of the characteristic of the noise cancellation signal processing section 6 in the DSP 60 alone can be changed, for example.

In the case where the IIR filter is adopted in the noise cancellation signal processing section 6A, the change of the filter characteristic can be achieved in the following manner, for example.

First, as the digital filter that forms the noise cancellation signal processing section 6A, a plurality of second-order IIR filters are provided. Here, considering the actual number of operation steps and so on, five IIR filters 65-1, 65-2, 65-3, 65-4, and 65-5 are prepared as the second-order IIR filters. Besides, an appropriate pattern of how these IIR filters 65-1 to 65-5 are connected is selected from patterns as shown in FIGS. 9 to 15 in accordance with the characteristic required in the noise cancellation signal processing section 6A.

Figure 9:
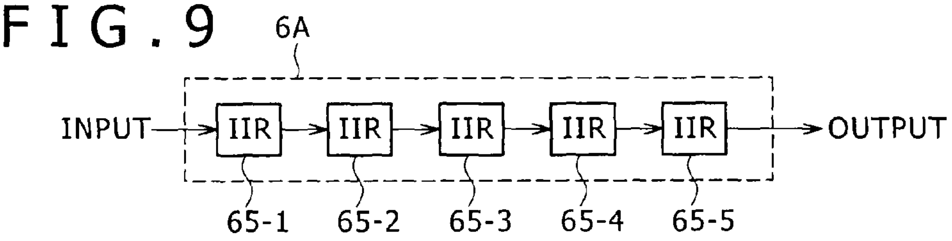
FIGS. 9 to 15 show examples of how IIR filters are connected with one another when the noise cancellation signal processing section in the second noise cancellation signal processing system are formed by the IIR filters.

FIG. 9 shows a pattern in which the IIR filters 65-1, 65-2, 65-3, 65-4, and 65-5 are connected in series. In this case, the signal is first inputted to the IIR filter 65-1 at the first stage, and the signal is outputted from the IIR filter 65-5 at the last stage.

Figure 10:
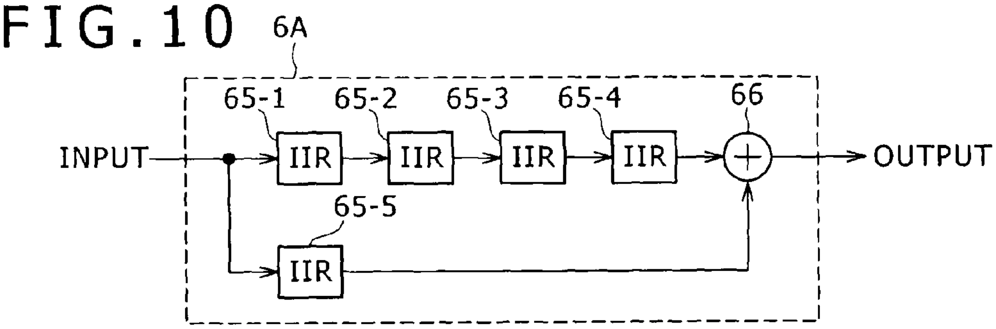

FIG. 10 shows a pattern in which a system composed of the IIR filters 65-1, 65-2, 65-3, and 65-4 connected in series and a system composed of only the IIR filter 65-5 are arranged in parallel. In this case, the signal is inputted to both the systems, and outputs from the two systems are combined by a combiner 66 and thus outputted from the noise cancellation signal processing section 6A.

Figure 11:
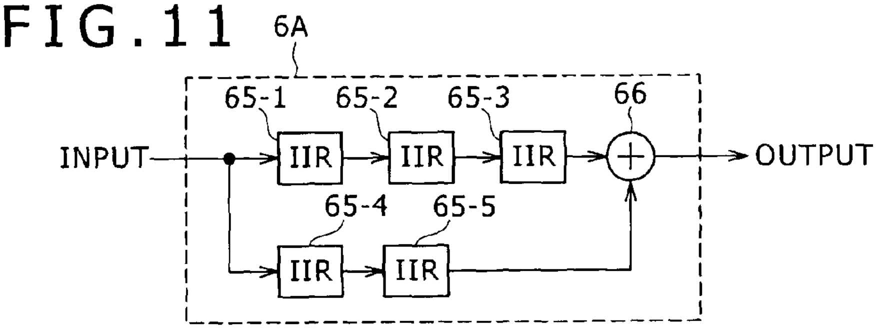

FIG. 11 shows a pattern in which a system composed of the IIR filters 65-1, 65-2, and 65-3 connected in series and a system composed of the IIR filters 65-4 and 65-5 connected in series are arranged in parallel. In this case, the input signal is inputted to both the systems, and outputs from the two systems are combined by the combiner 66 and thus outputted from the noise cancellation signal processing section 6A.

Figure 12:
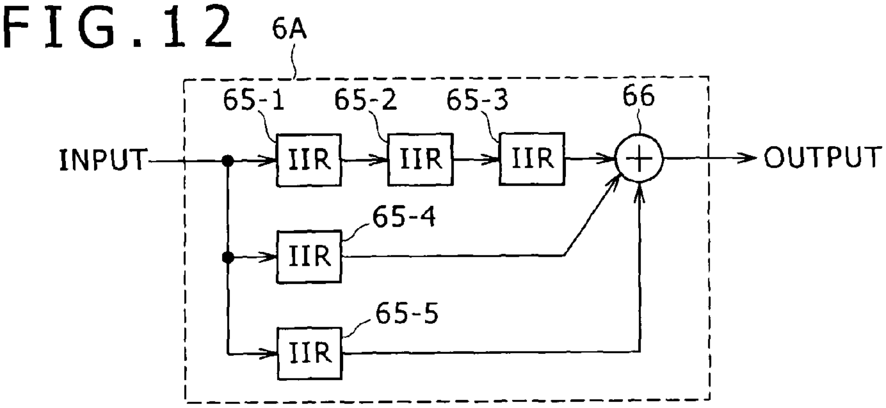

FIG. 12 shows a pattern in which a system composed of the IIR filters 65-1, 65-2, and 65-3 connected in series, a system composed of only the IIR filter 65-4, and a system composed of only the IIR filter 65-5 are arranged in parallel. In this case, the input signal is inputted to all of the three systems, and outputs from the three systems are combined by the combiner 66 and thus outputted from the noise cancellation signal processing section 6A.

Figure 13:
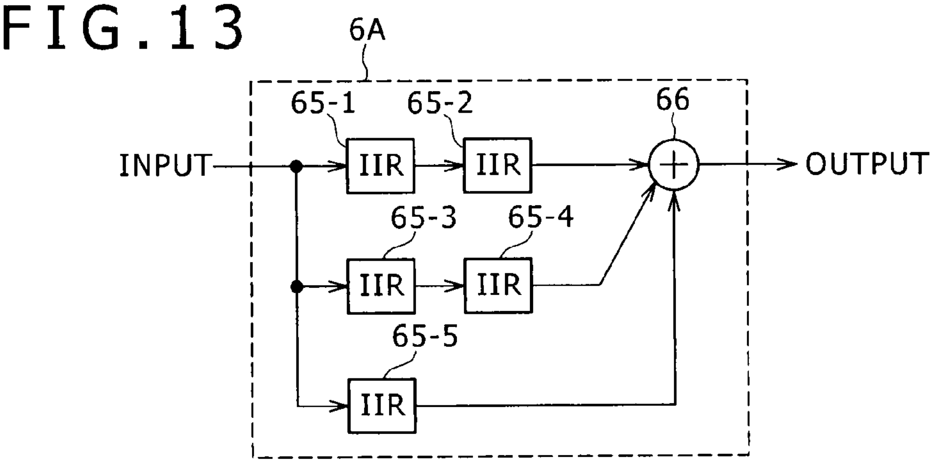

FIG. 13 shows a pattern in which a system composed of the IIR filters 65-1 and 65-2 connected in series, a system composed of the IIR filters 65-3 and 65-4 connected in series, and a system composed of only the IIR filter 65-5 are arranged in parallel. In this case, the input signal is inputted to all of the three systems, and outputs from the three systems are combined by the combiner 66 and thus outputted from the noise cancellation signal processing section 6A.

Figure 14:
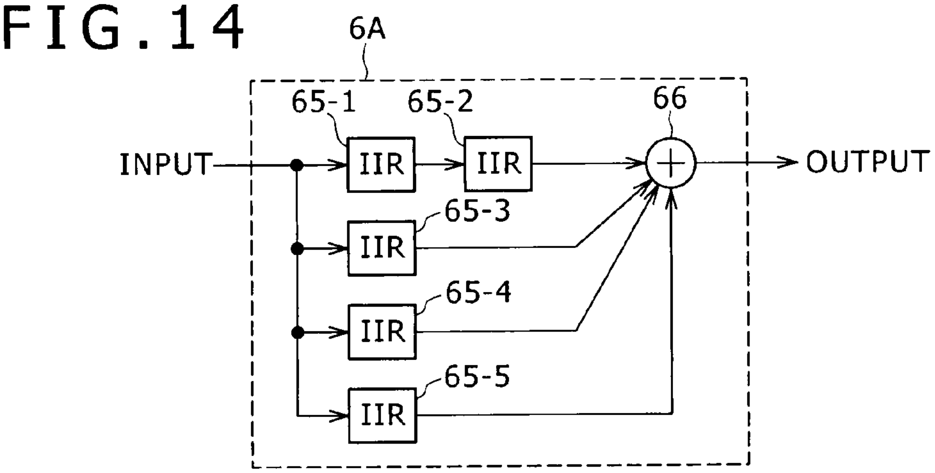

FIG. 14 shows a pattern in which a system composed of the IIR filters 65-1 and 65-2 connected in series, a system composed of only the IIR filter 65-3, a system composed of only the IIR filter 65-4, and a system composed of only the IIR filter 65-5 are arranged in parallel. In this case, the input signal is inputted to all of the four systems, and outputs from the four systems are combined by the combiner 66 and thus outputted from the noise cancellation signal processing section 6A.

Figure 15:
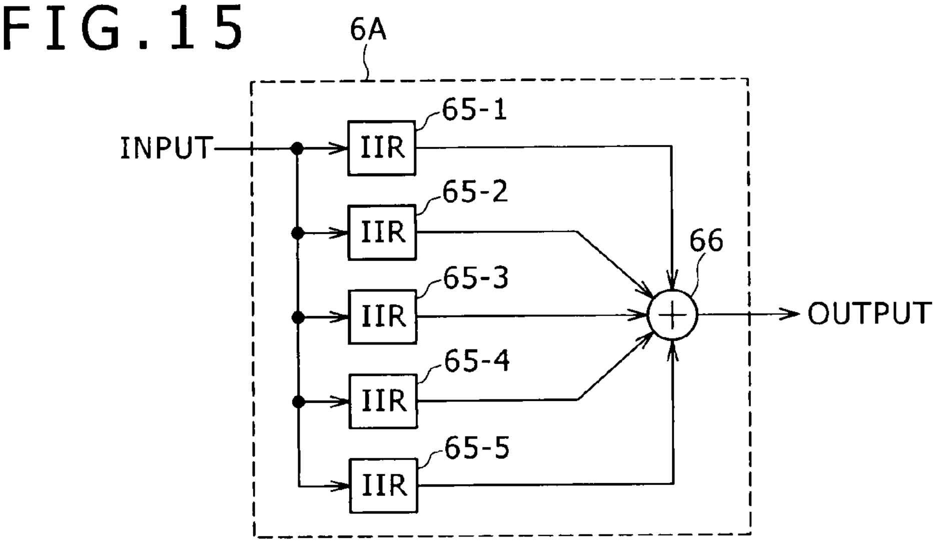

FIG. 15 shows a pattern in which the IIR filter 65-1, the IIR filter 65-2, the IIR filter 65-3, the IIR filter 65-4, and the IIR filter 65-5 are arranged in parallel. In this case, the input signal is inputted to all of the five filters, and outputs from the five filters are combined by the combiner 66 and thus outputted from the noise cancellation signal processing section 6A.

Note that the structures as shown in FIGS. 9 to 15 can be realized with a minimum of hardware resources by reusing the same hardware resources along a time axis using a technique such as a sequencer, for example.

As described above, in the case where the first functional mode is adopted, it is preferable that the noise cancellation signal processing section 6 within the DSP 60 be formed by the IIR filter. When the noise cancellation signal processing section 6 is formed by the IIR filter, the structures described above with reference to FIGS. 9 to 15 can be adopted by programming for the DSP 60.

Figure 16:
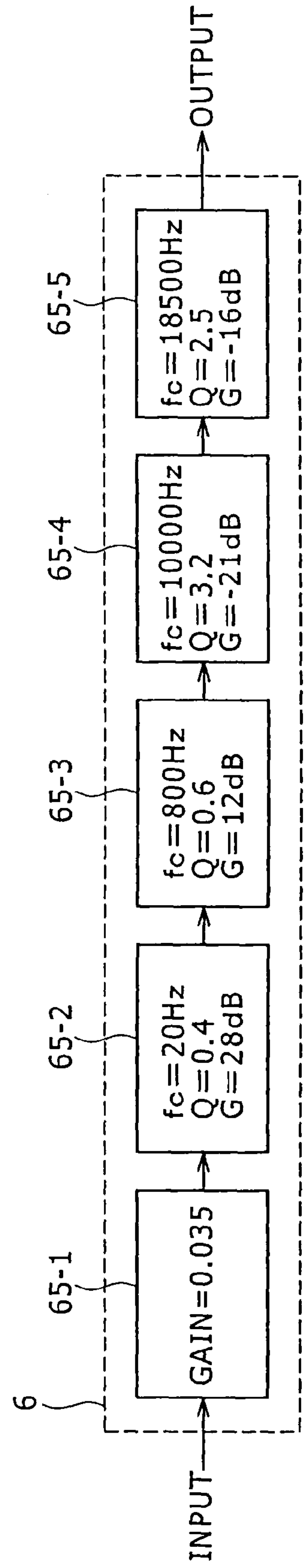
FIG. 16 shows an example of how characteristics are set in each of the IIR filters when the IIR filters are connected with one another in the manner shown in FIG. 9.

FIG. 16 shows an example of how characteristics are set in each of the IIR filters 65-1 to 65-5 in the case where the first functional mode is adopted for the noise cancellation system according to the present embodiment and the pattern as shown in FIG. 9 is adopted for the noise cancellation signal processing section 6 within the DSP 60.

In this case, first, the IIR filter 65-1 at the first stage is provided with a function as a gain setting circuit for giving a gain to an input signal and outputting a resultant signal. Here, a gain coefficient (Gain) is set at 0.035.

Each of the IIR filters 65-2 to 65-5 at the second to fifth (last) stages is provided with a function as a so-called parametric equalizer. As to equalizer characteristics, a center frequency fc of 20 Hz, a Q value of 0.4, and a gain value G of 28 dB are set for the IIR filter 65-2; a center frequency fc of 800 Hz, a Q value of 0.6, and a gain value G of 12 dB are set for the IIR filter 65-3; a center frequency fc of 10000 Hz, a Q value of 3.2, and a gain value G of −21 dB are set for the IIR filter 65-4; and a center frequency fc of 18500 Hz, a Q value of 2.5, and a gain value G of −16 dB are set for the IIR filter 65-5.

Although not shown in the figure, the noise cancellation signal processing section 6A is configured to function as a gain control circuit in accordance with the above configuration of the noise cancellation signal processing section 6. A gain coefficient thereof is set at 0.012, for example.

Figure 21A:
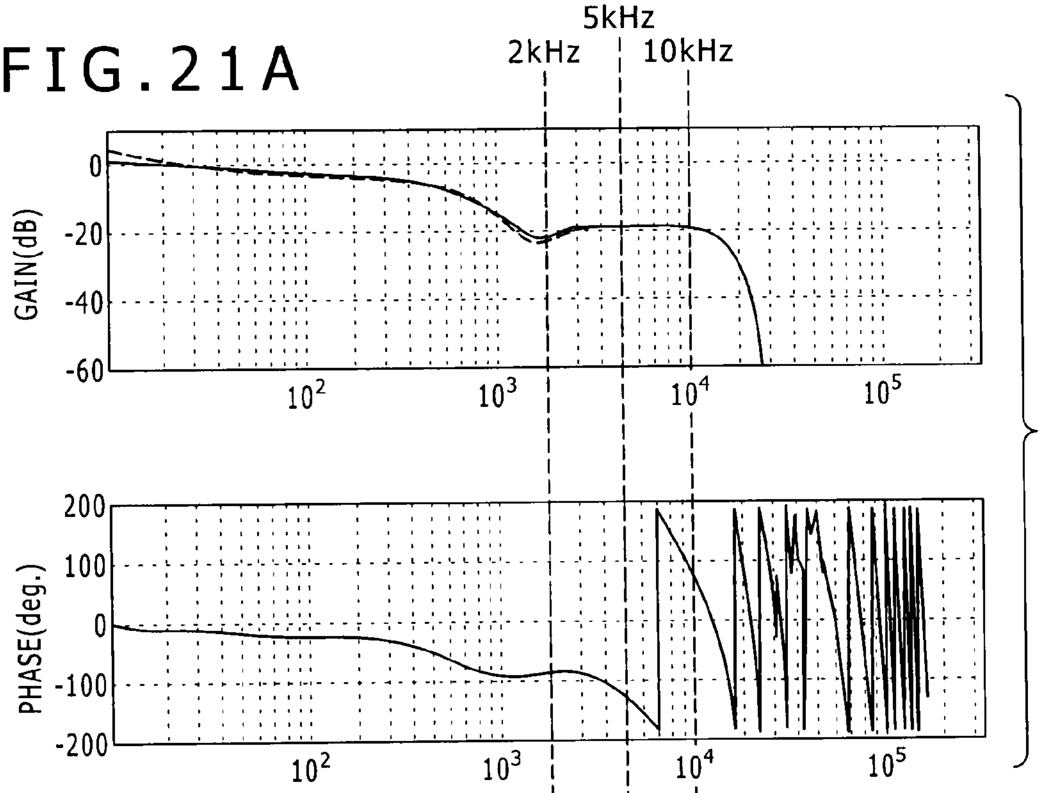
FIGS. 21A and 21B are Bode plots showing characteristics concerning the noise cancellation system having the single path structure as shown in FIG. 4 and the noise cancellation system having the dual path structure as shown in FIG. 6.
Figure 21B:
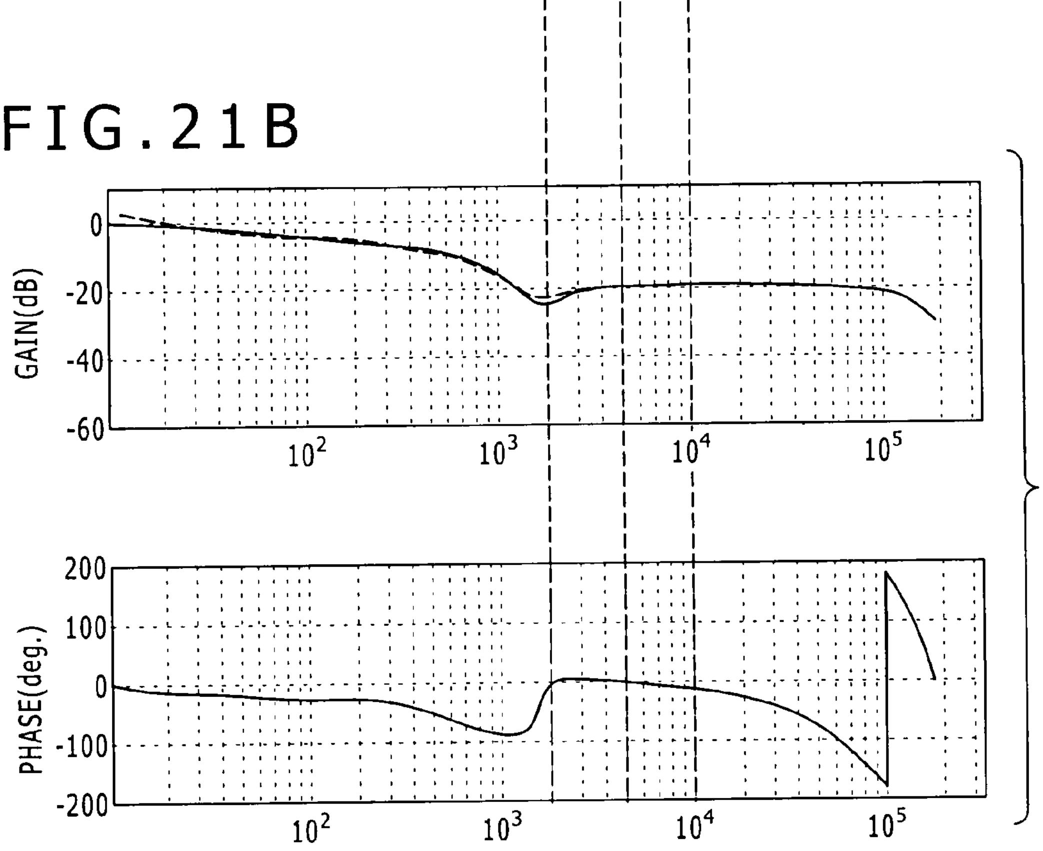

FIGS. 21A and 21B are Bode plots illustrating results of comparison of the characteristics of the noise cancellation system having the structure (design) as shown in FIG. 4 (i.e., the noise cancellation system having the single path structure) and those of the noise cancellation system according to the present embodiment (i.e., the noise cancellation system having the dual path structure), which has the structure (design) as shown in FIG. 6. The Bode plot of FIG. 21A shows a frequency versus gain characteristic and a frequency versus phase characteristic of the noise cancellation system having the single path structure as shown in FIG. 4, whereas the Bode plot of FIG. 21B shows a frequency versus gain characteristic and a frequency versus phase characteristic of the noise cancellation system having the dual path structure as shown in FIG. 6. In order to achieve the characteristics as shown in FIG. 21B, it is assumed that the minimum phase FIR filter is adopted for the digital filters as the decimation filter 5B and the anti-imaging filter 7*b* in FIG. 6, while the noise cancellation signal processing section 6A is formed by the IIR filter.

It is assumed here, for example, that a target frequency versus gain characteristic to be required for the noise cancellation system in accordance with the feedforward system is a characteristic represented by a broken line in graphs showing the frequency versus gain characteristics in FIGS. 21A and 21B. Note that, concerning the target characteristic represented by the broken line, the upper limit of frequency is set at around 2 kHz because the frequency range of the sounds that are actually to be subjected to noise cancellation is up to approximately 2 kHz. In the frequency versus gain characteristic as shown in FIG. 21B, the gain continues to be maintained above a certain level up to close to 100 kHz, while in the frequency versus gain characteristic as shown in FIG. 21A, the gain decreases abruptly in the vicinity of 20 kHz. This is because, since the noise cancellation system having the structure as shown in FIG. 4 performs the noise cancellation process on only the signals with a sampling frequency of 1 fs, a frequency range higher than a sampling frequency expressed as fs/2 is removed in order to avoid aliasing based on the sampling theorem. Note that, because fs is assumed to be 44.1 kHz in this case, the frequency versus gain characteristic as shown in FIG. 21A represents a result in which the frequency range higher than 22.05 kHz has been decreased.

Here, FIG. 21A and FIG. 21B will be compared with each other, for example. First, the frequency versus gain characteristics are almost the same in both figures in the frequency range up to approximately 2 kHz, noises in which frequency range are actually to be cancelled. On the other hand, regarding the frequency versus phase characteristics, values very close to 0 deg. are obtained in the range of about 2 kHz to about 10 kHz in FIG. 21B, which corresponds to the dual path structure, while in FIG. 21A, which corresponds to the single path structure, value fluctuation in the same range of about 2 kHz to about 10 kHz is so sharp that a phase rotation of greater than 100 deg. in absolute value occurs. As shown above, the noise cancellation system according to the present embodiment actually produces an effect of a significant reduction in phase rotation of the signal. Thus, despite the fact that it is a digital system, the noise cancellation system according to the present embodiment is actually capable of producing a practically sufficient noise cancellation effect.

Figure 17:
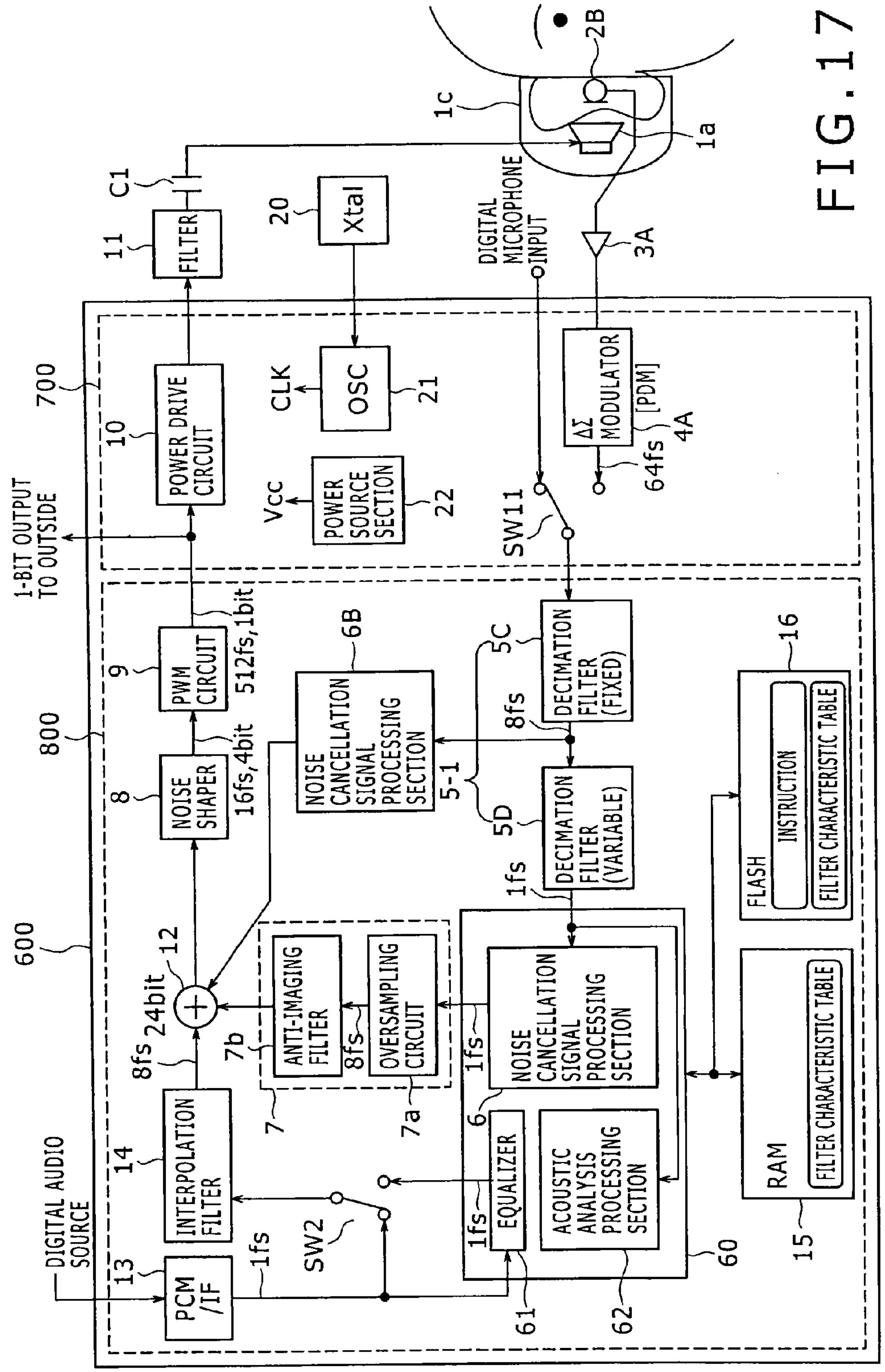
FIG. 17 is a block diagram showing an exemplary structure of a noise cancellation system according to a second embodiment of the present invention.

FIG. 17 shows an exemplary structure of a noise cancellation system according to a second embodiment of the present invention. Note that, in FIG. 17, components that have their counterparts in FIG. 6, which corresponds to the first embodiment, are assigned the same reference numerals as those of their counterparts in FIG. 6, and descriptions thereof will be omitted.

As described above with reference to FIGS. 1 to 3, the noise cancellation systems for the headphone devices are broadly classified into the feedforward system and the feedback system. The first embodiment described above has a structure based on the feedforward system. The present invention is applicable not only to the feedforward system but also to the feedback system. Thus, the exemplary structure of the noise cancellation system based on the feedback system, the model of which is illustrated in FIGS. 1A and 1B, will be described as the second embodiment.

In the case of the feedback system, as schematically shown in FIG. 17, a microphone 2B is arranged at a position within the headphone unit 1*c* so that the sound outputted from the driver 1*a* can be picked up near the ear of the user wearing the headphone.

Sounds picked up by the microphone 2B at this position include not only the sound outputted from the driver but also external sound components that have intruded into the housing of the headphone device and are about to arrive at the ear of the user wearing the headphone device, for example. A signal of the sounds picked up in the above manner is amplified by an amplifier 3A to be converted into an analog audio signal. Then, the analog audio signal is inputted to a ΔΣ modulator 4A in the analog block 700 within the LSI 600 to be converted into a digital audio signal with a sampling frequency of 64 fs and a quantization bit rate of 1 bit. This digital audio signal is inputted to a decimation filter 5C in a decimation filter 5-1 in the digital block 800 through a switch SW11.

In this case also, a digital microphone input is provided in parallel with the microphone 2B in order to provide expandability. The switch SW11 can be used to select between a digital audio signal supplied from this digital microphone input and the digital audio signal outputted from the ΔΣ modulator 4A, which is originally from the microphone 2B.

The decimation filter 5-1 is a filter for performing decimation on the signal in the [64 fs, 1 bit] form obtained by A/D conversion in a noise cancellation signal processing system in accordance with the feedback system, so that the sampling frequency of the signal is changed to a suitable sampling frequency for signal processing in the digital block 800. The decimation filter 5-1 corresponds to the decimation filter 5 in FIG. 6. Decimation filters 5C and 5D, which constitute the decimation filter 5-1, correspond to the decimation filters 5A and 5B, respectively, in FIG. 6. A signal having a sampling frequency of 8 fs obtained as a result of decimation by the decimation filter 5C is inputted to a noise cancellation signal processing section 6B and the decimation filter 5D. A signal having a sampling frequency of 1 fs obtained as a result of decimation by the decimation filter 5D is inputted to the noise cancellation signal processing section 6 in the DSP 60. The noise cancellation signal processing section 6B is provided in a second noise cancellation signal processing system suited to the feedback system, and corresponds to the noise cancellation signal processing section 6A in FIG. 6.

In this embodiment, each of the noise cancellation signal processing sections 6 and 6B gives a required characteristic to the signal inputted thereto, for example, thereby generating an audio signal of a sound that, as a noise cancellation-use audio signal, has a characteristic for canceling the external sound that will arrive at the ear, corresponding to the driver 1*a*, of the user wearing the headphone. Generally speaking, this process corresponds to a process of giving the transfer function −β for noise cancellation to the signal of the sound picked up.

Note that the concepts of the first and second functional modes and the structures in accordance with the first and second functional modes, which have been described above with reference to the first embodiment, are also applicable to the noise cancellation signal processing sections 6 and 6B in the second embodiment. Also note that the forms and structures of the digital filters as the noise cancellation signal processing sections 6 and 6A in the first embodiment are also applicable as the forms and structures of digital filters as the noise cancellation signal processing sections 6 and 6B in the second embodiment.

Regarding the feedback system, use of the equalizer 61 within the DSP 60 as a part of the first noise cancellation signal processing system is effective for obtaining an excellent noise cancellation effect.

In this case, the equalizer 61 gives a characteristic based on a transfer function 1+β to the signal of the digital audio source. In the case of the feedback system, the noise cancellation-use audio signal outputted from the noise cancellation signal processing section 6 includes not only a component corresponding to the external sound but also a component corresponding to a sound of the digital audio source outputted from the driver 1*a* and picked up by the microphone 2B. That is, a characteristic corresponding to a transfer function expressed as 1/1+β is given to the component corresponding to the sound of the digital audio source. Accordingly, the equalizer 61 is configured to give, in advance, the characteristic based on the transfer function 1+β, which is the inverse of 1/1+β, to the signal of the digital audio source. Thus, when the signal of the digital audio source outputted from the interpolation filter 14 has been combined by the combiner 12 with the noise cancellation-use audio signal, the above transfer characteristic 1/1+β is cancelled. Thus, the signal outputted from the combiner 12 is composed of a combination of a signal component having a characteristic for canceling the external sound and a signal component corresponding to the original signal of the digital audio source.

The components that follow the combiner 12 in this embodiment are equivalent to their counterparts in FIG. 6. That is, the signal outputted from the combiner 12 passes through the noise shaper 8, the PWM circuit 9, and the power drive circuit 10 to be converted into an amplified audio signal. Then, this amplified audio signal is supplied to the driver 1*a* via the filter 11 and the capacitor C1 to drive the driver 1*a* to output the sound.

As described above, in the feedback system, the external sound component that has intruded into the housing of the headphone device and the sound outputted from the driver are picked up near the ear of the user wearing the headphone, so that the signal used for noise cancellation is generated. Then, this signal used for noise cancellation is outputted from the driver so as to involve negative feedback. As a result, a sound that contributes to canceling the external sound to relatively emphasize the sound of the digital audio source will reach the ear, corresponding to the driver 1*a*, of the user wearing the headphone device.

As with the noise cancellation system according to the first embodiment, the above-described noise cancellation system in accordance with the feedback system is provided with the second noise cancellation signal processing system, which includes the noise cancellation signal processing section 6B, in addition to the first noise cancellation signal processing system, which includes the noise cancellation signal processing section 6 in the DSP 60. Thus, this noise cancellation system is capable of achieving a similar effect to that of the first embodiment.

Figure 18:
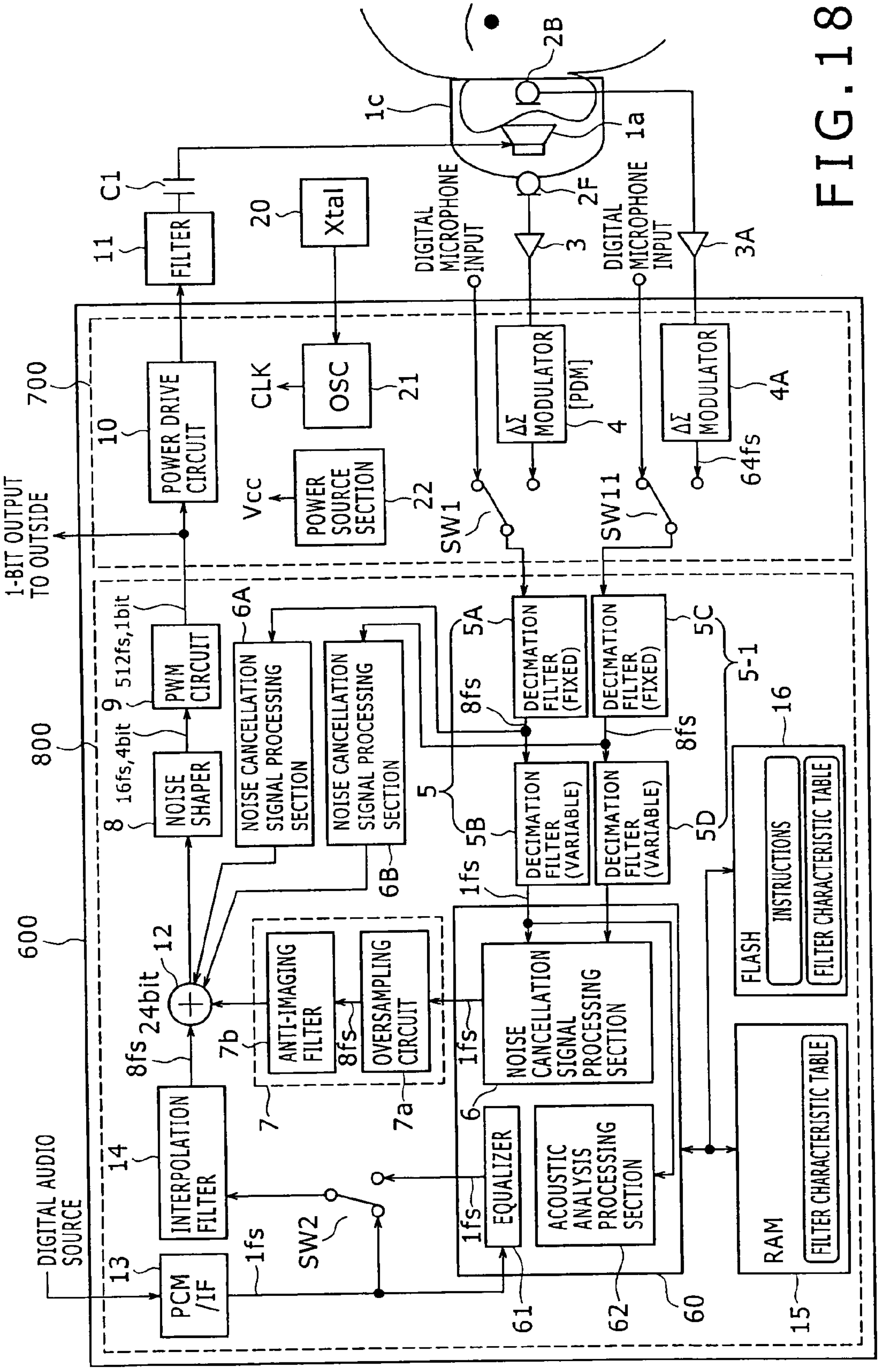
FIG. 18 is a block diagram showing an exemplary structure of a noise cancellation system according to a third embodiment of the present invention.

FIG. 18 shows an exemplary structure of a noise cancellation system according to a third embodiment of the present invention. Note that, in FIG. 18, components that have their counterparts in FIG. 6 or 17, which correspond to the first and second embodiments, are assigned the same reference numerals as those of their counterparts in FIG. 6 or 17, and descriptions thereof will be omitted.

The noise cancellation system according to the third embodiment includes both a system in accordance with the feedforward system, as does the noise cancellation system according to the first embodiment, and a system in accordance with the feedback system, as does the noise cancellation system according to the second embodiment.

As briefly mentioned previously, the feedback system and the feedforward system have different features that trade off each other.

For example, in the feedforward system, the frequency range of noises that can be effectively cancelled (attenuated) is wide and system stability is good, but it is difficult to achieve sufficient noise cancellation. Thus, it has been pointed out that the transfer functions in the system may become improper depending on conditions such as relative positions of the microphone and the noise source, for example, so that noises in a particular frequency range is not cancelled or is increased, for example. When this happens, although noise cancellation is actually working effectively throughout a wide frequency range, a phenomenon of noises in a specific frequency range being emphasized occurs, so that the noise cancellation effect can hardly be perceived by the ear.

In contrast, in the feedback system, the frequency range of noises that can be cancelled is narrow, but sufficient noise cancellation can be achieved.

This shows that if a noise cancellation system is constructed using a combination of the feedforward system and the feedback system, the disadvantages of both systems compensate for each other, and thus, it becomes possible to easily cancel noises throughout a wide frequency range effectively. That is, a more excellent noise cancellation effect may be achieved than when the noise cancellation system is based on only one of the two systems.

In the noise cancellation system according to the third embodiment as shown in FIG. 18, first, the microphone 2F, the amplifier 3, the ΔΣ modulator 4, the switch SW1, the decimation filter 5 (i.e., the decimation filters 5A and 5B), and the noise cancellation signal processing section 6A, which correspond to the system in accordance with the feedforward system, are provided, as with the noise cancellation system as shown in FIG. 6. In addition, the microphone 2B, the amplifier 3A, the ΔΣ modulator 4A, the switch SW11, the decimation filter 5-1 (i.e., the decimation filters 5C and 5D), and the noise cancellation signal processing section 6B, which correspond to the system in accordance with the feedback system, are provided, as with the noise cancellation system as shown in FIG. 17.

The noise cancellation signal processing section 6 in the DSP 60 in this embodiment accepts a signal outputted from the decimation filter 5B, which forms a part of the system in accordance with the feedforward system, and a signal outputted from the decimation filter 5D, which forms a part of the system in accordance with the feedback system, and generates and outputs a noise cancellation-use audio signal based thereon.

In practice, the noise cancellation signal processing section 6 in this embodiment has a filter for accepting the signal outputted from the decimation filter 5B and generating a noise cancellation-use audio signal corresponding to the feedforward system, and a filter for accepting the signal outputted from the decimation filter 5D and generating a noise cancellation-use audio signal corresponding to the feedback system. Then, the two noise cancellation-use audio signals generated by these filters are combined inside the noise cancellation signal processing section 6, for example, and the combined signal is outputted to the interpolation filter 7.

Then, the combiner 12 in this embodiment combines the noise cancellation-use audio signals outputted from the noise cancellation signal processing sections 6A and 6B and the interpolation filter 7 and the signal of the digital audio source outputted from the interpolation filter 14, and outputs a resultant signal to the subsequent circuit (i.e., the noise shaper 8).

As described above, the noise cancellation system according to the third embodiment is constructed using both the first and second noise cancellation signal processing systems in accordance with the feedforward system as shown in FIG. 6 and the first and second noise cancellation signal processing systems in accordance with the feedback system as shown in FIG. 17. As a result, as noted previously, a more excellent noise cancellation effect is achieved than when the noise cancellation system is based on only one of the two systems.

Figure 19:
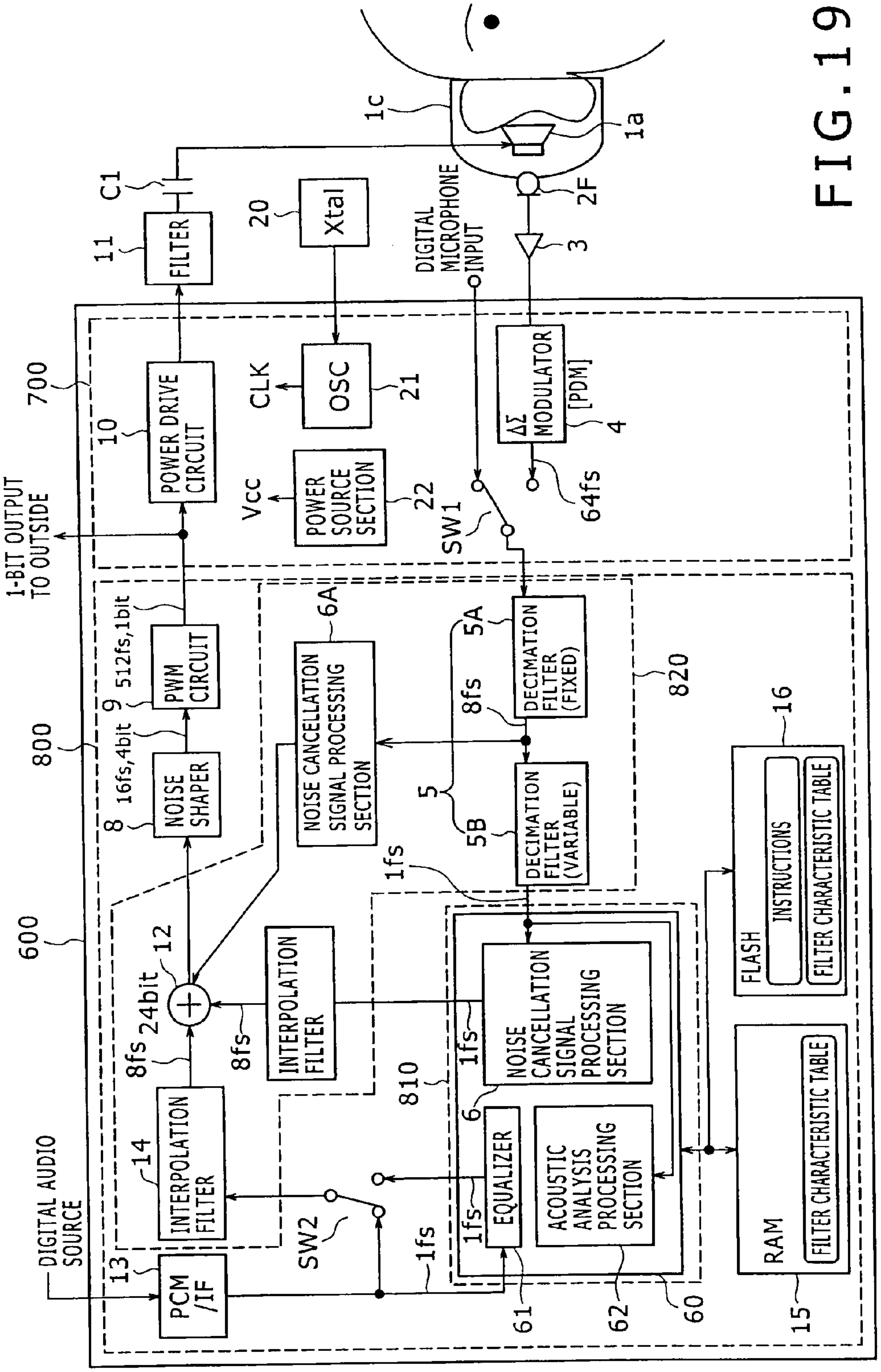
FIG. 19 is a block diagram showing an exemplary structure of a noise cancellation system according to a fourth embodiment of the present invention.

FIG. 19 shows an exemplary structure of a noise cancellation system according to a fourth embodiment of the present invention. Note that the noise cancellation system as shown in FIG. 19 is based on the feedforward system, and that components of this noise cancellation system are the same as those of the noise cancellation system as shown in FIG. 6.

In the first embodiment as shown in FIG. 6, the digital block 800 is manufactured as a single chip. However, all sampling frequencies of the signals inputted to or outputted from the functional circuit parts within the digital block 800 are not the same, but there are some types of sampling frequencies. In the case where supported sampling frequencies are different between the functional circuit parts as described above, taking account of conditions when actually manufacturing the LSI or the like, manufacture of the LSI can be done more efficiently by grouping the functional circuit parts within the digital block 800 by supported sampling frequency, and arranging functional circuit parts belonging to the same group in the same chip while arranging those belonging to different groups in separate chips.

As such, in the present embodiment, the chip that forms the digital block 800 is structured as follows.

Two main sampling frequencies among the sampling frequencies of the signals handled in the digital block 800 as shown in FIG. 19 are 1 fs, which is primarily handled by the DSP 60, corresponding to the first noise cancellation signal processing system, and 8 fs, which is supported by the second noise cancellation signal processing system.

Accordingly, in the present embodiment, as shown in FIG. 19, a first signal processing chip 810 is manufactured as a chip on which at least the circuit components of the DSP 60, which supports 1 fs, are formed, while a second signal processing chip 820 is manufactured as a chip on which at least circuit components as the decimation filter 5 (5A and 5B), the noise cancellation signal processing section 6A, the interpolation filter 7, the interpolation filter 14, and the combiner 12, which are functional circuit parts that support 8 fs, are formed.

Note that each of the functional circuit parts that are included in the digital block 800 but not included in either of the first signal processing chip 810 and the second signal processing chip 820 in FIG. 19 may be included in an appropriate one of the first signal processing chip 810 and the second signal processing chip 820. Alternatively, other chips may be manufactured in addition to the first signal processing chip 810 and the second signal processing chip 820, and such functional circuit parts may be included in those other chips.

Note that the structure of the fourth embodiment as shown in FIG. 19 is also applicable in a similar manner to the digital block 800 in the noise cancellation system according to the second embodiment as shown in FIG. 17, which is in accordance with the feedback system.

That is, the first signal processing chip 810 on which at least the circuit components of the DSP 60, which supports 1 fs, are formed and the second signal processing chip 820 on which at least the circuit components as the decimation filter 5-1 (5C and 5D), the noise cancellation signal processing section 6B, the interpolation filter 7, the interpolation filter 14, and the combiner 12, which are functional circuit parts that support 8 fs, are formed may be manufactured.

Further, the structure of the fourth embodiment is also applicable to the digital block 800 in the noise cancellation system according to the third embodiment as shown in FIG. 18, which uses the feedforward system and the feedback system in combination. Such a structure is shown in FIG. 20 as a fifth embodiment of the present invention.

Figure 20:
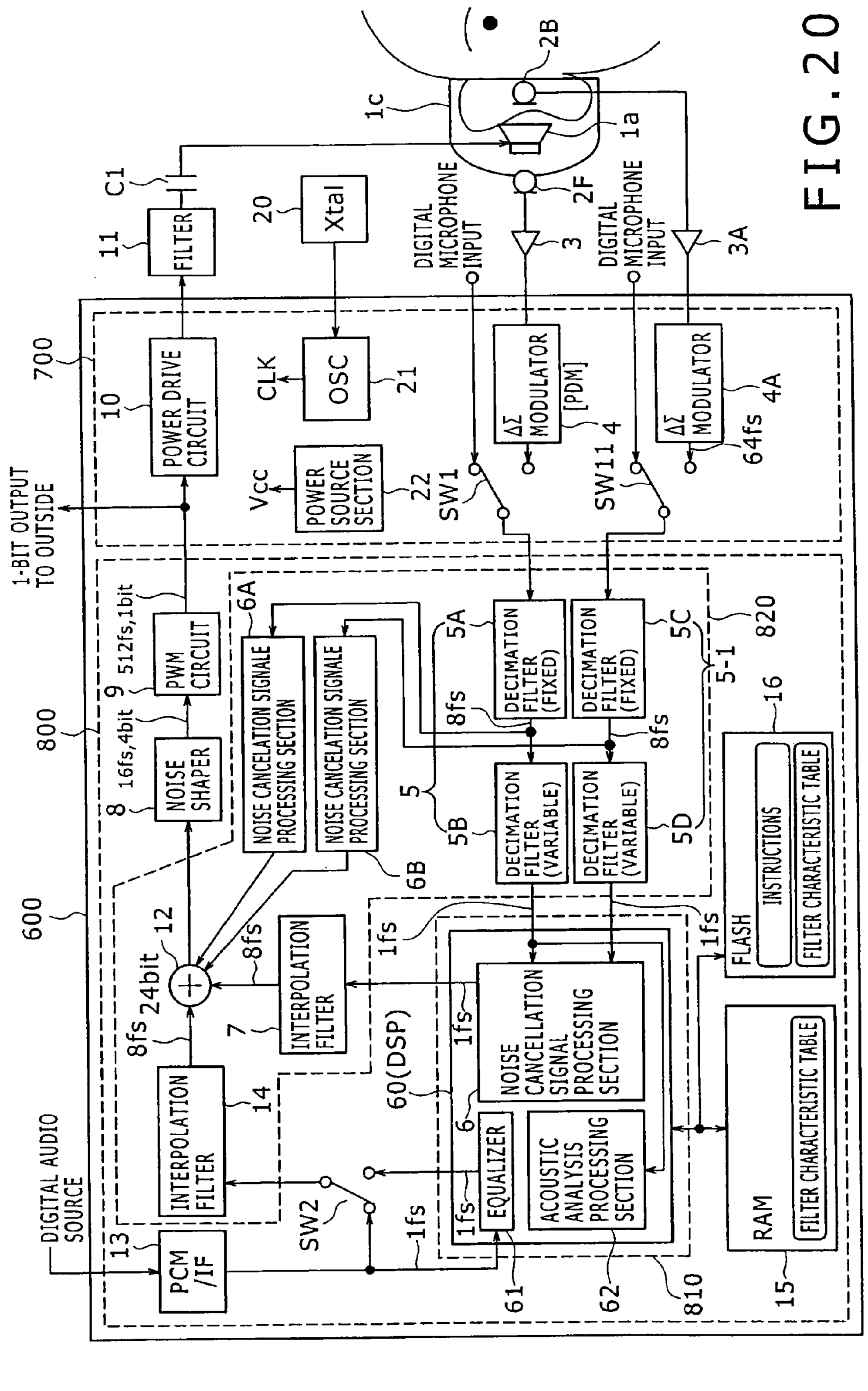
FIG. 20 is a block diagram showing an exemplary structure of a noise cancellation system according to a fifth embodiment of the present invention.

FIG. 20 shows the first signal processing chip 810 on which at least the circuit components of the DSP 60, which supports 1 fs, are formed and second signal processing chip 820 on which at least the circuit components as the decimation filters 5 and 5-1 (5A, 5B, 5C, and 5D), the noise cancellation signal processing sections 6A and 6B, the interpolation filter 7, the interpolation filter 14, and the combiner 12, which are functional circuit parts that support 8 fs, are formed.

Note that the sampling frequencies and the quantization bit rates of the signals inputted to or outputted from the functional circuit parts within the LSI 600 in the above-described embodiments are simply typical examples, and that the sampling frequency and the quantization bit rate handled by each functional circuit part may be changed as necessary as long as the noise cancellation system does not fail to function as such.

The noise cancellation systems according to the above-described embodiments have the dual path structure, having the two systems, the first noise cancellation signal processing system and the second noise cancellation signal processing system. However, by extension, a structure in which a plurality of second noise cancellation signal processing systems are provided is also conceivable within the scope of the present invention, for example. In such a structure, a signal with a separate sampling frequency is inputted to each of the plurality of second noise cancellation signal processing systems, for example, to generate the noise cancellation-use audio signal. In such a manner, a different role may be assigned to each of the plurality of second noise cancellation signal processing systems. The structure in which two or more second noise cancellation signal processing systems are provided will be referred to also as a "multipath" structure.

Here, a model example of a signal processing system which forms a basis of this multipath structure, in which two or more second noise cancellation signal processing systems are provided as described above, will now be described below with reference to FIG. 22.

Figure 22:
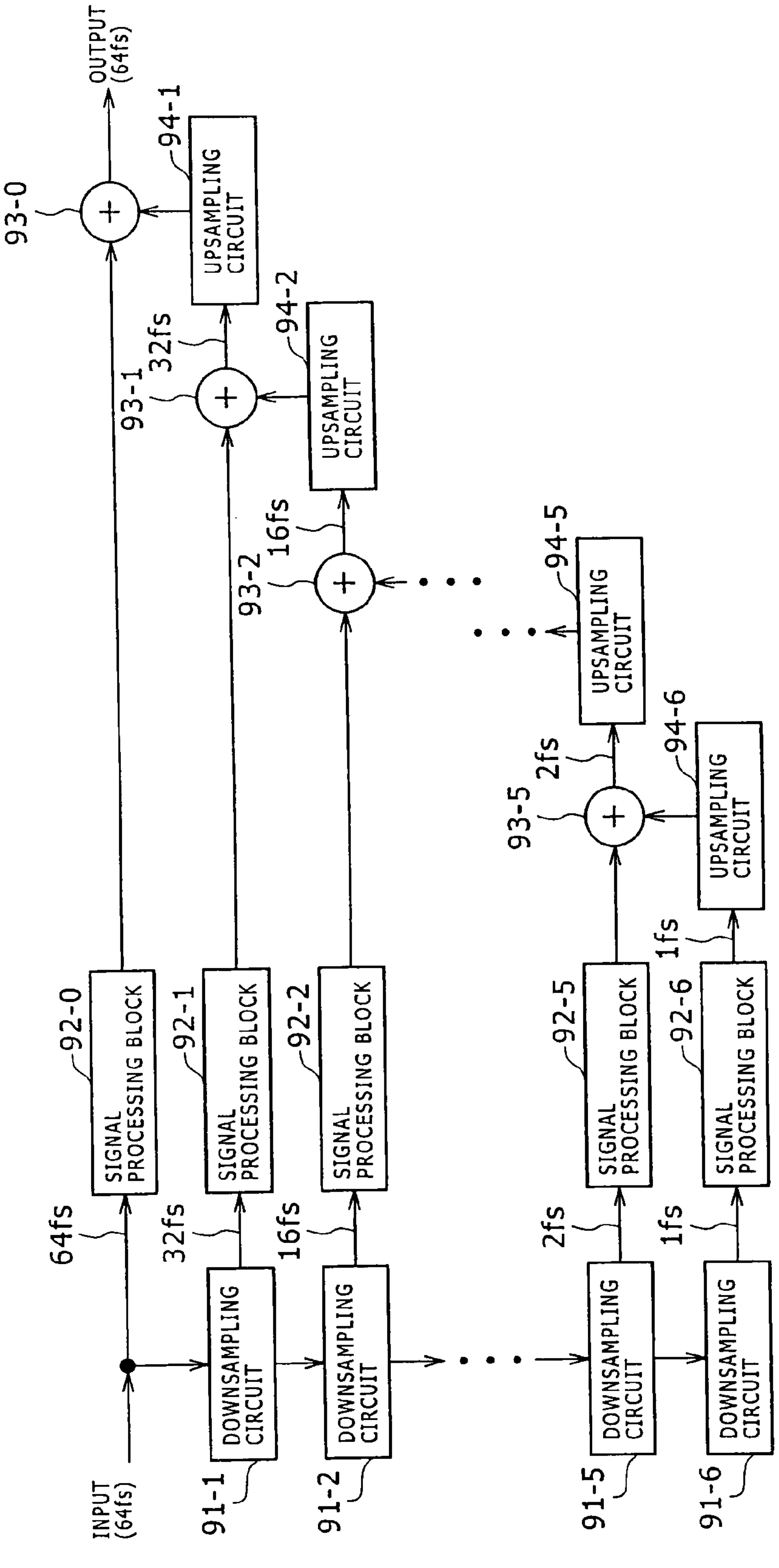
FIG. 22 is a block diagram showing a model example of a signal processing system that forms a basis of a multipath structure.

FIG. 22 shows a model example in which a signal with a sampling frequency of 64 fs is routed to multiple paths, and such signals are finally combined to be outputted as a combined signal with the same sampling frequency of 64 fs.

In FIG. 22, first, downsampling circuits 91-1 to 91-6, signal processing blocks 92-0 to 92-6, upsampling circuits 94-1 to 94-6, and combiners 93-0 to 93-5 are provided.

Each of the downsampling circuits 91-1 to 91-6 downsamples an input signal so as to halve the sampling frequency, and outputs a resultant signal. These downsampling circuits 91-1 to 91-6 are connected in series, and the input signal with a sampling frequency of 64 fs is inputted to the downsampling circuit 91-1 at the first stage. Thus, the downsampling circuits 91-1 to 91-6 output signals obtained by converting the sampling frequency of the input signal into 32 fs, 16 fs, 8 fs, 4 fs, 2 fs, and 1 fs, respectively. Note that the signals with a sampling frequency of 32 fs or lower have a predetermined quantization bit rate of multiple bits.

The signal processing blocks 92-0 to 92-6 are parts for performing signal processing on the input signal in accordance with a given purpose, and are formed by digital filters to which predetermined signal characteristics have been assigned, for example. These signal processing blocks correspond to the noise cancellation signal processing section 6A in each of the multiple paths.

To these signal processing blocks 92-0 to 92-6, the input signal with a sampling frequency of 64 fs and the signals with sampling frequencies of 32 fs, 16 fs, 8 fs, 4 fs, 2 fs, and 1 fs outputted from the downsampling circuits 91-1 to 91-6 are inputted, respectively. The signal processing blocks 92-0 to 92-6 accept these signals, respectively, and produce output signals with the same sampling frequency (and the same quantization bit rate) as those of their respective input signals.

Each of the upsampling circuits 94-1 to 94-6 upsamples an input signal so as to double the sampling frequency, and outputs a resultant signal. To the upsampling circuits 94-1 to 94-5, signals with sampling frequencies of 32 fs, 16 fs, 8 fs, 4 fs, and 2 fs outputted from the combiners 93-1 to 93-5 described below are inputted, respectively. To the upsampling circuit 94-6, a signal with a sampling frequency of 1 fs outputted from the signal processing block 92-6 is inputted.

The combiners 93-0 to 93-5 accept the signals with sampling frequencies of 64 fs, 32 fs, 16 fs, 8 fs, 4 fs, and 2 fs outputted from the signal processing blocks 92-0 to 92-5, respectively, and additionally accept the signals with sampling frequencies of 64 fs, 32 fs, 16 fs, 8 fs, 4 fs, and 2 fs outputted from the upsampling circuits 94-1 to 94-6, respectively, and combine them. The signals outputted from the combiners 93-1 to 93-5 are inputted to the upsampling circuits 94-1 to 94-5, respectively. The signal outputted from the combiner 93-0 is a final output signal with a sampling frequency of 64 fs.

When actually providing multiple second noise cancellation signal processing systems, necessary downsampling circuits, upsampling circuits, and combiners are provided based on the structure as shown in FIG. 22 so that the multiple second noise cancellation signal processing systems handle necessary sampling frequencies, and the signal processing block (i.e., the noise cancellation signal processing section) in each of the multiple second noise cancellation signal processing systems is configured to perform necessary signal processing.

Note that, in the above-described embodiments, the decimation filter 5B (5D) and the anti-imaging filter 7*b* in the interpolation filter 7 are formed by the minimum phase FIR filter or the IIR filter in order to effectively reduce phase rotation. However, other types of digital filters than the minimum phase FIR filter and the IIR filter may also be used for those functional circuit parts as long as delays caused by them are sufficiently short to allow a required noise cancellation effect to be achieved and allow other conditions such as sound quality and stability to be maintained above a sufficient level.

Also note that, in one embodiment of the present invention, the minimum phase FIR filter or the IIR filter may be adopted for only at least one of the decimation filter 5B (5D) and the anti-imaging filter 7*b*. Even with such a structure, the delay caused by the signal processing system for noise cancellation is reduced compared to when the linear phase FIR filter is adopted for both the decimation filter 5B (5D) and the anti-imaging filter 7*b*, for example, and thus a correspondingly much effect is likely to be achieved.

The manner in which the parts that constitute a noise cancellation system according to one embodiment of the present invention are implemented on an actual apparatus or system may be determined arbitrarily depending on the structure, application, and so on of the apparatus or system to which the noise cancellation system is applied.

For example, in the case where a headphone device that fulfills a noise cancellation function by itself is constructed, most of the parts (i.e., the LSI 600) that form the noise cancellation system may be contained within a housing of the headphone device. In the case where a noise cancellation system is formed by a combination of a headphone device and an external device such as an adapter, the LSI 600 may be provided in the external device such as the adapter. Moreover, the functional circuit parts within the LSI 600 may be grouped into a plurality of parts, and at least one of the parts may be provided in the external device such as the adapter.

In the case where a noise cancellation system according to one embodiment of the present invention is implemented not on the headphone device or the like but on a mobile phone device, a network audio communication device, an audio player, or the like that is configured to reproduce audio content and output the reproduced content to a headphone terminal, for example, at least one part other than the microphone and the driver may be provided in such a device.

It can be said that, according to the present invention, digital signal processing required for one functional purpose is divided among a plurality of signal processing systems that support different sampling frequencies in order to thereby achieve some beneficial effect. Such functional purposes are not limited to noise cancellation. The present invention is also applicable to other functional purposes than noise cancellation.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus, comprising:

a first decimation processing section configured to generate, based on a digital signal in a first form subjected to $\Delta\Sigma$ modulation with a predetermined quantization bit rate of one or more bits, a digital signal in a second form subjected to pulse-code modulation so as to have a sampling frequency of $n \times fs$, where n is a natural number and fs is a predetermined reference sampling frequency;

a second decimation processing section configured to generate, based on the digital signal in the second form, a digital signal in a third form subjected to pulse-code modulation so as to have a sampling frequency of $m \times fs$, where m is a natural number less than n;

a first signal processing section configured to perform predetermined signal processing based on the digital signal in the third form;

an interpolation processing section configured to convert a digital signal in the third form outputted from said first signal processing section into a digital signal in the second form;

a second signal processing section configured to perform the predetermined signal processing based on the digital signal in the second form outputted from said first decimation processing section; and a combining section configured to combine the digital signal in the second form outputted from said interpolation processing section and a digital signal in the second form outputted from said second signal processing section, and output a combined digital signal.

2. The signal processing apparatus according to claim 1, wherein the predetermined signal processing performed by said first signal processing section and said second signal processing section is signal processing for giving a predetermined cancellation signal characteristic for canceling a predetermined cancellation target sound.

3. The signal processing apparatus according to claim 1, wherein a filter characteristic for giving a signal characteristic for canceling components of a predetermined cancellation target sound, the components being in a frequency range below a predetermined level, is set in said first signal processing section, and a filter characteristic for giving a signal characteristic for canceling components of the predetermined cancellation target sound, the components being in a frequency range above the predetermined level, is set in at least one of said second decimation processing section and said interpolation processing section.

4. The signal processing apparatus according to claim 1, wherein said first signal processing section performs the processing as a result of a predetermined program being executed by a digital signal processor.

5. The signal processing apparatus according to claim 1, further comprising an analysis section configured to perform a predetermined analysis process based on the digital signal outputted from said first signal processing section, and, based on a result of the analysis process, change a filter characteristic of at least one of a digital filter that forms said first signal processing section, a digital filter that forms said second signal processing section, a digital filter that forms said second decimation processing section, and a digital filter that forms said interpolation processing section.

6. The signal processing apparatus according to claim 1, wherein said second signal processing section is implemented in hardware.

7. The signal processing apparatus according to claim 1, wherein said second signal processing section is formed by a linear phase finite impulse response digital filter.

8. The signal processing apparatus according to claim 1, wherein said second signal processing section is formed by an infinite impulse response digital filter.

9. The signal processing apparatus according to claim 1, wherein said second signal processing section includes a predetermined number of infinite impulse response digital filters, each having a predetermined filter order, and arranges the digital filters so as to be connected according to a predetermined pattern to obtain a desired characteristic.

10. The signal processing apparatus according to claim 1, wherein the digital signal in the first form is a signal obtained by performing $\Delta\Sigma$ modulation on a signal obtained by a microphone in a noise cancellation headphone device in accordance with a feedforward system picking up a sound.

11. The signal processing apparatus according to claim 1, wherein the digital signal in the first form is a signal obtained by performing ΔΣ modulation on a signal obtained by a microphone in a noise cancellation headphone device in accordance with a feedback system picking up a sound.

12. The signal processing apparatus according to claim 1, wherein said first decimation processing section includes a first feedforward decimation processing section configured to accept, as the digital signal in the first form, a signal obtained by performing ΔΣ modulation on a signal obtained by a microphone in a noise cancellation headphone device in accordance with a feedforward system picking up a sound, and a first feedback decimation processing section configured to accept, as the digital signal in the first form, a signal obtained by performing ΔΣ modulation on a signal obtained by a microphone in a noise cancellation headphone device in accordance with a feedback system picking up a sound;

said second decimation processing section includes a second feedforward decimation processing section configured to accept a signal outputted from the first feedforward decimation processing section, and a second feedback decimation processing section configured to accept a signal outputted from the first feedback decimation processing section;

said second signal processing section includes a feedforward signal processing section configured to accept a signal outputted from the first feedforward decimation processing section, and a feedback signal processing section configured to accept a signal outputted from the first feedback decimation processing section;

said first signal processing section accepts a signal from the second feedforward decimation processing section, gives a predetermined cancellation signal characteristic in accordance with the feedforward system to the accepted signal, and outputs a resultant signal to said interpolation processing section, and also accepts a signal outputted from the second feedback decimation processing section, gives a predetermined cancellation signal characteristic in accordance with the feedback system to the accepted signal, and outputs a resultant signal to said interpolation processing section; and said combining section combines at least a signal outputted from the feedforward signal processing section, a signal outputted from the feedback signal processing section, and a signal outputted from said interpolation processing section.

13. The signal processing apparatus according to claim 1, wherein the signal processing apparatus is provided within a single chip.

14. A signal processing method, comprising:

a first decimation processing step of generating, based on a digital signal in a first form subjected to ΔΣ modulation with a predetermined quantization bit rate of one or more bits, a digital signal in a second form subjected to pulse-code modulation so as to have a sampling frequency of n×fs, where n is a natural number and fs is a predetermined reference sampling frequency;

a second decimation processing step of generating, based on the digital signal in the second form, a digital signal in a third form subjected to pulse-code modulation so as to have a sampling frequency of m×fs, where m is a natural number less than n;

a first signal processing step of performing predetermined signal processing based on the digital signal in the third form;

an interpolation processing step of converting a digital signal in the third form outputted in said first signal processing step into a digital signal in the second form;

a second signal processing step of performing the predetermined signal processing based on the digital signal in the second form outputted in said first decimation processing step; and a combining step of combining the digital signal in the second form outputted in said interpolation processing step and a digital signal in the second form outputted in said second signal processing step, and outputting a combined digital signal.

15. A signal processing apparatus, comprising:

first decimation processing means for generating, based on a digital signal in a first form subjected to ΔΣ modulation with a predetermined quantization bit rate of one or more bits, a digital signal in a second form subjected to pulse-code modulation so as to have a sampling frequency of n×fs, where n is a natural number and fs is a predetermined reference sampling frequency;

second decimation processing means for generating, based on the digital signal in the second form, a digital signal in a third form subjected to pulse-code modulation so as to have a sampling frequency of m×fs, where m is a natural number less than n;

first signal processing means for performing predetermined signal processing based on the digital signal in the third form;

interpolation processing means for converting a digital signal in the third form outputted from said first signal processing means into a digital signal in the second form;

second signal processing means for performing the predetermined signal processing based on the digital signal in the second form outputted from said first decimation processing means; and combining means for combining the digital signal in the second form outputted from said interpolation processing means and a digital signal in the second form outputted from said second signal processing means, and outputting a combined digital signal.

* * * * *